United States Patent
Shiraishi et al.

(10) Patent No.: US 11,049,965 B2
(45) Date of Patent: Jun. 29, 2021

(54) SEMICONDUCTOR DEVICE AND ALTERNATOR USING THE SAME

(71) Applicant: HITACHI POWER SEMICONDUCTOR DEVICE, LTD., Hitachi (JP)

(72) Inventors: Masaki Shiraishi, Tokyo (JP); Tetsuya Ishimaru, Tokyo (JP); Junichi Sakano, Tokyo (JP); Mutsuhiro Mori, Tokyo (JP); Shinichi Kurita, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 169 days.

(21) Appl. No.: 16/056,332

(22) Filed: Aug. 6, 2018

(65) Prior Publication Data

US 2019/0043984 A1 Feb. 7, 2019

(30) Foreign Application Priority Data

Aug. 7, 2017 (JP) .............................. JP2017-152305

(51) Int. Cl.
*H01L 29/78* (2006.01)
*H01L 29/66* (2006.01)
(Continued)

(52) U.S. Cl.
CPC ...... *H01L 29/7813* (2013.01); *H01L 27/0248* (2013.01); *H01L 29/1095* (2013.01);
(Continued)

(58) Field of Classification Search
CPC ............. H01L 27/0248; H01L 29/1095; H01L 29/456; H01L 29/66712; H01L 29/7812;
(Continued)

(56) References Cited

U.S. PATENT DOCUMENTS 9,831,145 B2 * 11/2017 Ishimaru ............... H01L 23/492
2003/0075759 A1 4/2003 Kawano et al.
(Continued)

FOREIGN PATENT DOCUMENTS

EP 3082243 A1 10/2016
JP 02-005482 A 1/1990
(Continued)

OTHER PUBLICATIONS

Extended European Search Report dated Jan. 3, 2019 for the European Patent Application No. 18187836.4.
(Continued)

*Primary Examiner* — Matthew C Landau
*Assistant Examiner* — Dmitriy Yemelyanov
(74) *Attorney, Agent, or Firm* — Volpe Koenig

(57) ABSTRACT

A semiconductor device includes a first external electrode with a first electrode surface portion; a second external electrode with a second electrode surface portion; a MOSFET chip with a built-in Zener diode which includes an active region and a peripheral region; a control IC chip which drives the MOSFET chip based on voltage or current between a drain electrode and a source electrode of the MOSFET chip; and a capacitor which supplies power to the MOSFET chip and the control IC chip. The first electrode surface portion is connected to either the drain electrode or the source, the second electrode surface portion is connected to either the source electrode or the drain electrode, a plurality of unit cells of the MOSFET with the built-in Zener diode are provided in the active region, and the breakdown voltage of the Zener diode is set to be lower than that of the peripheral region.

18 Claims, 17 Drawing Sheets

(51) Int. Cl.
*H01L 29/10* (2006.01)
*H03K 17/0814* (2006.01)
*H03K 17/74* (2006.01)
*H01L 27/02* (2006.01)
*H01L 29/45* (2006.01)

(52) U.S. Cl.
CPC .... *H01L 29/66712* (2013.01); *H01L 29/7812* (2013.01); *H03K 17/08142* (2013.01); *H03K 17/74* (2013.01); *H01L 29/456* (2013.01)

(58) Field of Classification Search
CPC ..... H01L 29/7813; H01L 29/66; H01L 29/78; H03K 17/08142; H03K 17/74; H03K 29/10
See application file for complete search history.

(56) References Cited

U.S. PATENT DOCUMENTS

| | | | |
|---|---|---|---|
| 2009/0173949 A1 | 7/2009 | Yatsuo et al. | |
| 2011/0062513 A1* | 3/2011 | Lin | H01L 29/66734 257/331 |
| 2011/0233714 A1 | 9/2011 | Lu | |
| 2014/0138710 A1* | 5/2014 | Ohtsu | H01L 24/89 257/77 |
| 2016/0315184 A1* | 10/2016 | Ishimaru | H01L 25/07 |
| 2016/0380554 A1 | 12/2016 | Baur et al. | |
| 2017/0047321 A1* | 2/2017 | Nishimura | H01L 27/0727 |
| 2017/0263516 A1 | 9/2017 | Ishimaru et al. | |

FOREIGN PATENT DOCUMENTS

| | | | |
|---|---|---|---|
| JP | 10-215552 A | 8/1998 | |
| JP | 2003-101021 A | 4/2003 | |
| JP | 2005-057049 A | 3/2005 | |
| JP | 2007-234925 A | 9/2007 | |
| JP | 2011-204710 A | 10/2011 | |
| JP | 2015-116043 A | 5/2015 | |
| TW | 201622099 A | 6/2016 | |
| WO | WO-2016039094 A1 * | 3/2016 | ............ H01L 24/01 |

OTHER PUBLICATIONS

Taiwanese Office Action dated Jan. 28, 2019 for the Taiwanese Patent Application No. 107127212.

Japanese Office Action dated Dec. 15, 2020 for Japanese Patent Application No. 2017-152305.

* cited by examiner

SEMICONDUCTOR DEVICE AND ALTERNATOR USING THE SAME

BACKGROUND OF THE INVENTION

1. Field of the Invention

The present invention relates to a semiconductor device and an alternator using the same.

2. Description of the Related Art

A diode or a metal-oxide-semiconductor-field-effect-transistor (MOSFET) is used as a rectifier element in an alternator which is equipped in an automobile to generate electric power. For example, JP 2015-116043 A and JP 10-215552 A disclose the technology.

In addition, in the rectifier element used for the alternator, characteristics related to the breakdown voltage are important, and for example, JP 2005-57049 A, JP 2003-101021 A, and JP H02-005482 A disclose the technology.

The abstract of JP 2015-116043 A discloses a technology of a semiconductor device using a MOSFET using a rectifier element as "[Problem to be solved] To provide a semiconductor device which can be simply assembled with low loss, an alternator and a power conversion device. [Solution] A semiconductor device S1 of the present invention includes a first external electrode 101 having a peripheral portion 101s attached onto an alternator Ot, the peripheral portion 101s being formed in a circular shape in an upper surface view, a MOSFET chip 103, a control circuit 104 to which a voltage or a current of a first main terminal 103d and a second main terminal 103s of the MOSFET chip 103 is input and which generates a control signal to be supplied into a gate 103g of the MOSFET chip 103 based on the voltage or the current, and a capacitor 105 supplying power to the control circuit 104, and a second external electrode 107 mounted on an opposite side the first external electrode with respect to the MOSFET chip 103, wherein the first main terminal 103d of the MOSFET chip 103 and the first external electrode 101, and the second main terminal 103s of the MOSFET chip 103 and the second external electrode 107 are electrically connected".

In addition, the abstract of JP 10-215552 A discloses a technology for a rectifying device of an alternator using a diode as an rectifier element as "[Problem to be solved] To improve a heat-resistant life with a simple structure using a resin sealing structure without adding an intermediate member in a rectifier of an alternator. [Solution] In a resin sealing structure including a resin-made insulating member 175 which insulates and seals a bonded part between a semiconductor chip 170 and both electrode bodies 171 and 173, the insulating member 175 is charged at a high pressure exceeding an atmospheric pressure and is molded to generate a residual compressive stress in the insulating member 175. It is possible to reduce a thermal distortion of solders 172 and 174 and improve a thermal fatigue life by suppressing a free expansion in a direction parallel to a bonding surface of the semiconductor chip 170 by applying the residual compressive stress to the first and second electrode bodies 171 and 173 having a larger coefficient of linear expansion than that of the semiconductor chip 170.

In addition, the abstract of JP 2005-57049 A discloses a technology for a semiconductor device as "[Problem to be solved] To improve an avalanche resistance of a power MISFET without enlarging a cell pitch. [Solutions] By introducing, for example, B as impurity ion having p type conductivity from a bottom part of a contact groove 15, a p+ type semiconductor region 20 and an n– type single crystal silicone layer 1B are in contact with a lower part of the p+ type semiconductor region 20, a p type semiconductor region 21 having an impurity concentration lower than that of the p+ type semiconductor region 20 is formed and is in contact with an n– type single crystal silicon layer 1B of a lower part of the p type semiconductor region 21, and an n type semiconductor region 22 which is in contact with a p type semiconductor region 21 and having an impurity concentration higher than that of the n– type single crystal layer 1B is formed".

In addition, the abstract of JP 2003-101021 A discloses a technology for a field effect transistor as "[Problem to be solved] To provide a technology which can improve an avalanche breakdown strength of a field-effect transistor. [Solution] According to a MOSFET 1 of the present invention, a buried region 22 which configures a first PN junction 85 along with a body region 32 is formed under the body region 32. If a high voltage is applied to a MOSFET 1, the first PN junction 85 undergoes avalanche breakdown, and a current flows in the first PN junction 85. However, since the first PN junction 85 is formed on a bottom surface of the body region 32 and has a large area, even if a large current flows in the first PN junction 85, the current is distributed uniformly over the whole junction and thus a current concentration hardly occurs, so that a device breakdown due to the current concentration hardly occurs."

In addition, claim 1 of JP H02-005482 A discloses a technology for a vertical MOSFET as "A vertical MOSFET comprising: a second conductive region on a first conductivity type semiconductor substrate serving as a drain and a first conductivity type region serving as a source, and configured to control a source/drain current on a surface of the second conductivity region sandwiched between a substrate and the first conductivity type region based on a voltage applied to an insulating gate on a surface of the substrate, wherein a collector-base diode breakdown voltage of a parasitic transistor generated on the second conductivity type region as a base is set to be equal to or lower than the collector/emitter breakdown voltage of the parasitic transistor.

SUMMARY OF THE INVENTION

However, the technologies disclosed in the above-mentioned Patent Literatures 1 to 5 have the following problems.

In an alternator, when a phenomenon called a load dump that an output terminal of the alternator or a terminal of a battery is disconnected when a power generation operation occurs, energy generated by power generation is consumed therein so that a high voltage is not output to the output terminal of the alternator. In other words, a semiconductor device (rectifier element) used for the alternator needs to have not only the rectifying characteristics but also characteristics suitable for the load dump.

In JP 2015-116053 A, a suitable chip size in consideration of a temperature rise of devices at the time of the load dump, a specific structure in which a Zener diode is built in a MOSFET, and a relationship with a breakdown voltage of a peripheral region are not reviewed, and there are problems in practically designing and manufacturing the MOSFET while balancing elements such as characteristics, breakdown voltage, and costs of the MOSFET.

In JP H10-215552 A, the diode is used as the rectifier element. There is a problem that the diode has a forward voltage drop and a large loss.

JP 2005-57049 A, JP 2003-101021 A and JP H02-005482 A each disclose the technologies for the device structure suitable to improve the avalanche breakdown strength of the MOSFET, but do not review the influence of the temperature rise when a surge voltage is applied or the relationship with the breakdown voltage of the peripheral region. Therefore, as the rectifier element used for the alternator, there is a problem in practically designing and manufacturing the semiconductor device satisfying the influence of the temperature rise when the surge voltage is applied and characteristics of the breakdown voltage of the peripheral region.

The present invention has been made in consideration of the above-mentioned problems, and it is an object of the present invention to provide a semiconductor device (rectifier element) which can cope with a high output of an alternator.

In order to solve the above problems and achieve the object of the present invention, the following configuration was made.

That is, a semiconductor device of the present invention includes: a first external electrode which includes a first electrode surface portion; a second external electrode which includes a second electrode surface portion; a MOSFET chip with a built-in Zener diode which includes an active region in which a circuit current flows and a peripheral region holding a breakdown voltage at a peripheral portion; a control IC chip which drives a gate of the MOSFET chip with the built-in Zener diode based on a voltage or a current between a drain electrode and a source electrode of the MOSFET chip with the built-in Zener diode; and a capacitor which supplies power to the MOSFET chip with the built-in Zener diode and the control IC chip, wherein the first electrode surface portion is connected to either of the drain electrode or the source electrode of the MOSFET chip with the built-in Zener diode, the second electrode surface portion is connected to either of the source electrode or the drain electrode of the MOSFET chip with the built-in Zener diode, a plurality of unit cells of a MOSFET with the built-in Zener diode are provided in the active region of the MOSFET chip with the built-in Zener diode, and a breakdown voltage of the Zener diode included in the unit cell is set to be lower than the breakdown voltage of the peripheral region.

In addition, other means will be described in a mode for carrying out the invention According to the present invention, it is possible to provide the semiconductor device (rectifier element) capable of coping with the high output of the alternator.

DESCRIPTION OF THE PREFERRED EMBODIMENTS

Figure 1:
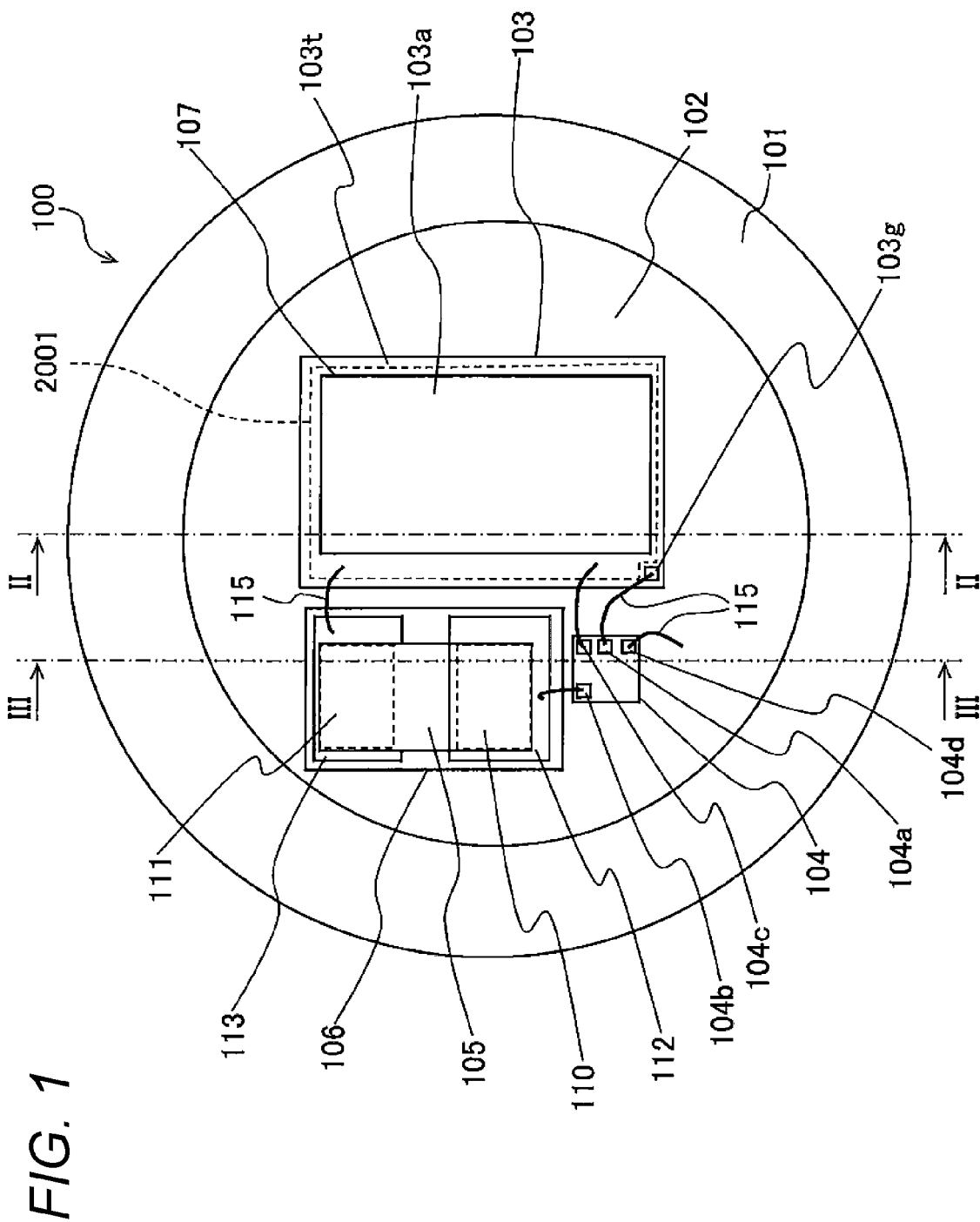
FIG. 1 is a diagram showing an example of a planar structure of a semiconductor device according to a first embodiment of the present invention.

Hereinafter, modes for carrying out the present invention (hereinafter referred to as "embodiments") will be described as appropriate with reference to the accompanying drawings. In each drawing for describing embodiments, parts having the same function are denoted by the same reference numerals and a description thereof will be omitted as appropriate. In addition, in the following description of the embodiments, a description of the same or similar parts will be omitted as appropriate unless specifically required.

First Embodiment

A configuration of a semiconductor device according to a first embodiment of the present invention will be described with reference to FIGS. 1 to 6.

FIG. 1 is a diagram schematically showing an example of a planar structure of a semiconductor device 100 according to the first embodiment of the present invention. For ease of understanding, a lead 107L (FIG. 2) and a resin 108 (FIG. 2) which are arranged on an upper part of the semiconductor device 100 are not described in FIG. 1.

Figure 2:
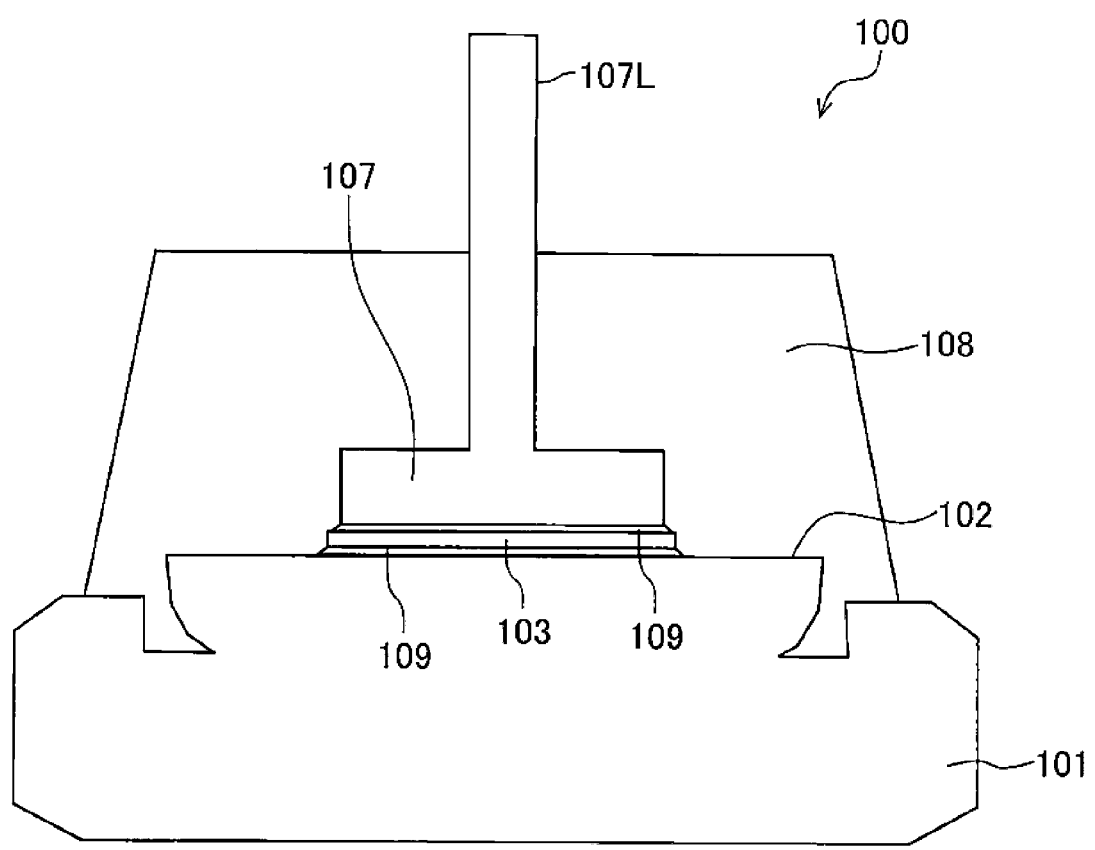
FIG. 2 is a diagram showing an example of a cross section structure of II-II shown in FIG. 1 of the semiconductor device according to the first embodiment of the present invention.

FIG. 2 is a diagram schematically showing an example of a cross section structure of II-II shown in FIG. 1 of the semiconductor device 100 according to the first embodiment of the present invention.

Figure 3:
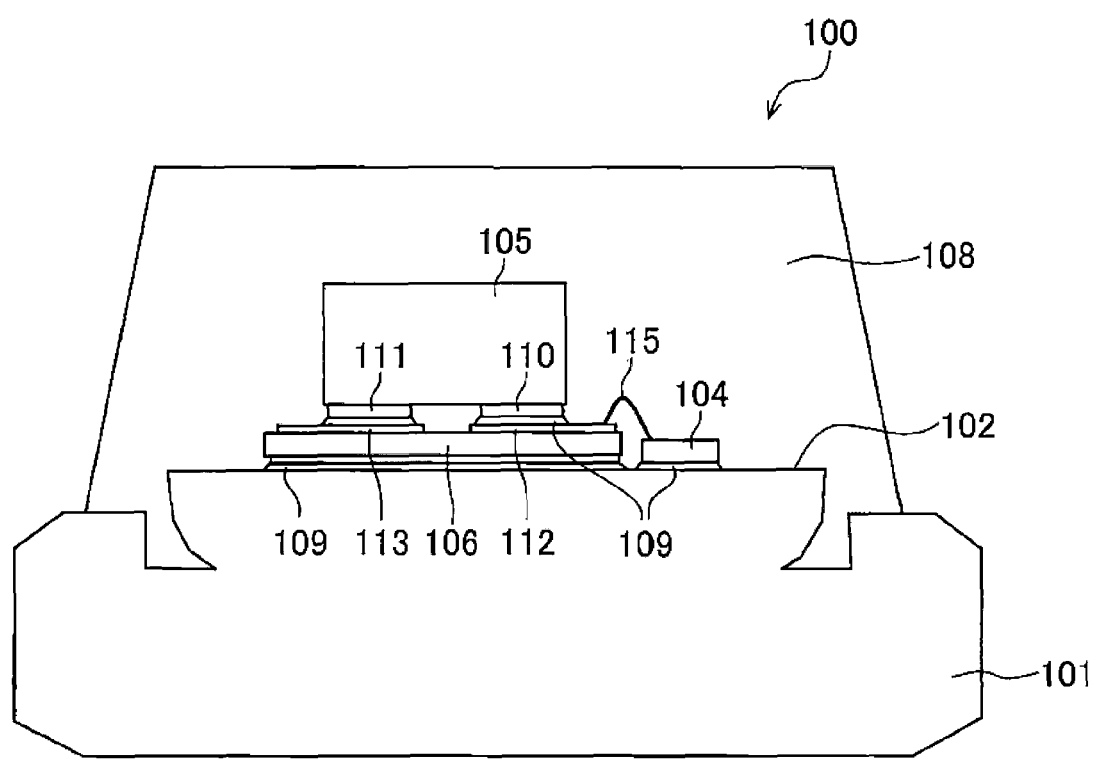
FIG. 3 is a diagram showing an example of a cross section structure of III-III shown in FIG. 1 of the semiconductor device according to the first embodiment of the present invention.

FIG. 3 is a diagram schematically showing an example of a cross section structure of III-III shown in FIG. 1 of the semiconductor device 100 according to the first embodiment of the present invention.

Figure 4:
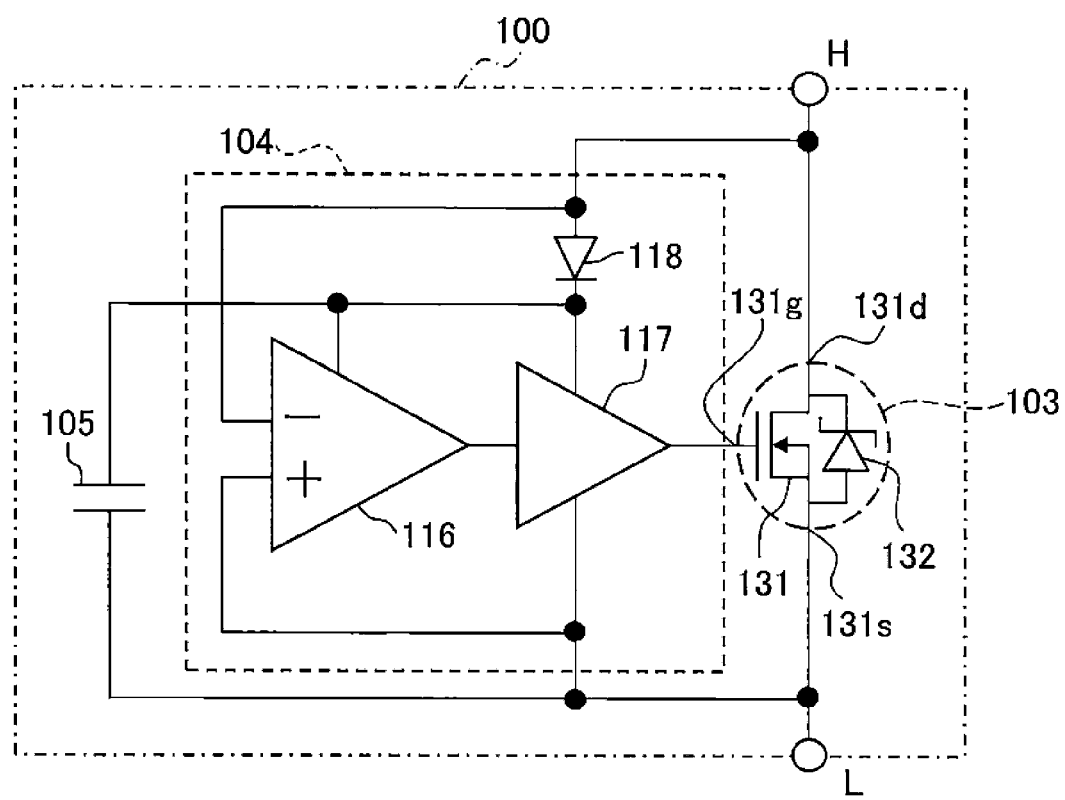
FIG. 4 is a diagram showing an example of a circuit configuration of the semiconductor device according to the first embodiment of the present invention.

FIG. 4 is a diagram showing an example of a circuit configuration of the semiconductor device 100 according to the first embodiment of the present invention.

Figure 5:
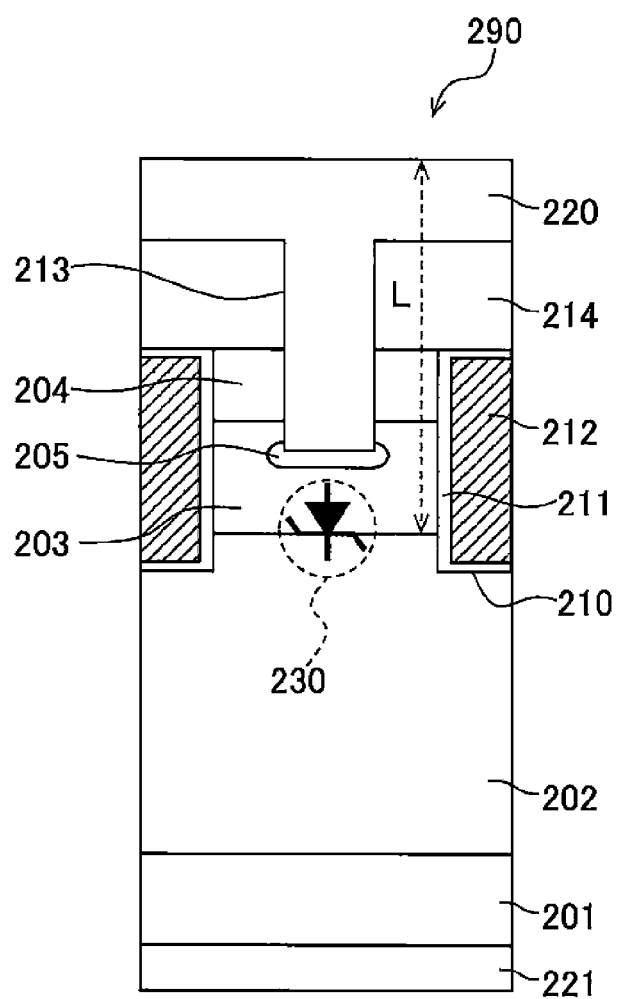
FIG. 5 is a diagram showing an example of a cross section structure of a unit cell of a MOSFET with a built-in Zener diode in an active region of the MOSFET chip with the built-in Zener diode according to the first embodiment of the present invention.

FIG. 5 is a diagram showing an example of a cross section structure of a unit cell of a MOSFET with a built-in Zener diode in an active region of the MOSFET chip 103 with the built-in Zener diode according to the first embodiment of the present invention.

Figure 6:
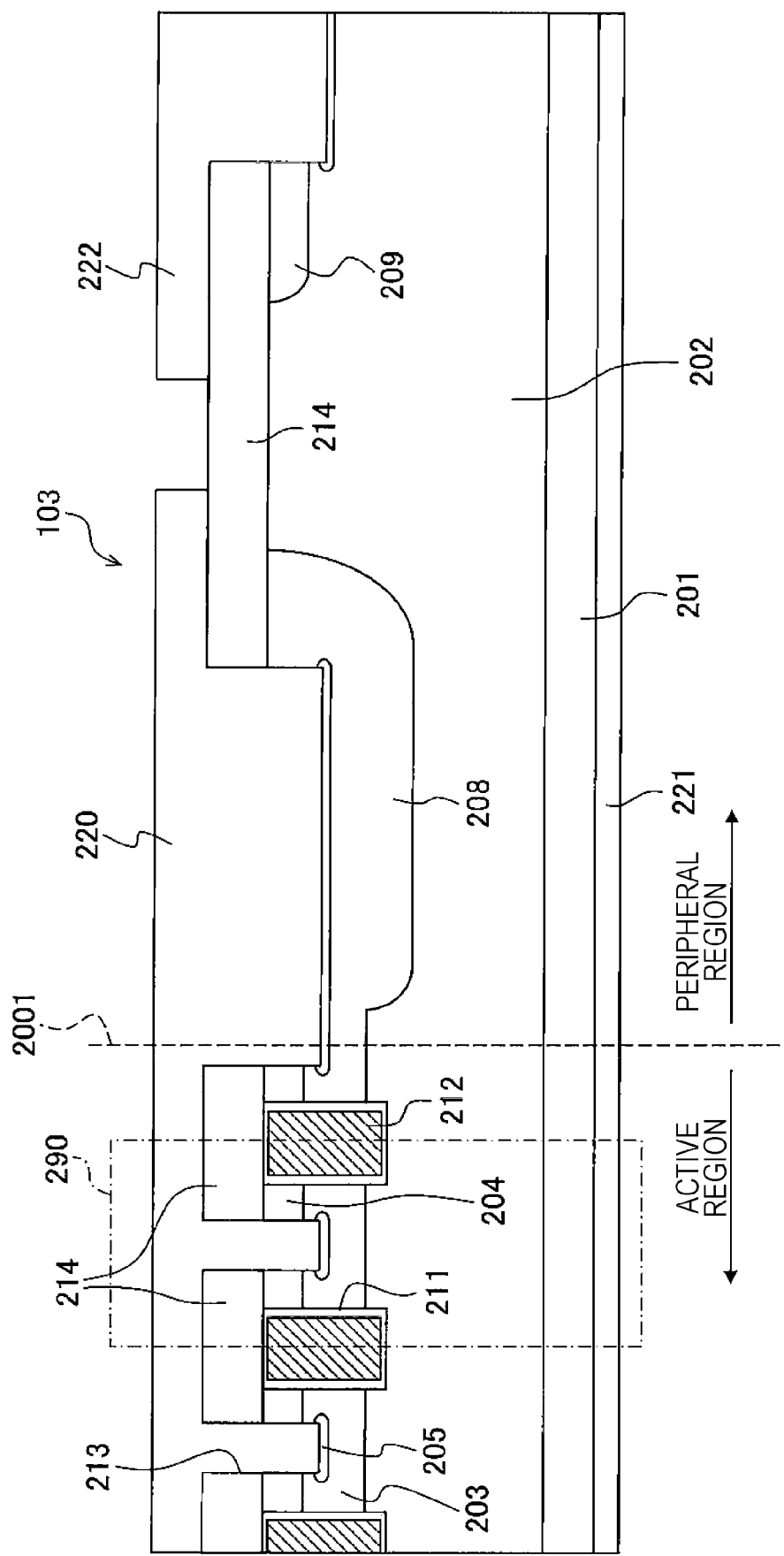
FIG. 6 is a diagram showing an example of a cross section structure of a peripheral region including a portion of the active region of the MOSFET chip with the built-in Zener diode according to the first embodiment of the present invention.

FIG. 6 is a diagram showing an example of a cross section structure of a peripheral region including a part of the active region of the MOSFET chip with the built-in Zener diode 103 according to the first embodiment of the present invention.

<<Components of Semiconductor Device 100 as Rectifier Element>>

First, components of the semiconductor device 100 as a rectifier element will be described with reference to FIGS. 1 to 3.

As shown in FIGS. 1 to 3, the semiconductor device (rectifier element) 100 includes a base electrode (first external electrode) 101 having a circular outer peripheral portion, a circular pedestal (first electrode surface portion, first external electrode) 102 which is provided on the base electrode 101.

In addition, a MOSFET chip 103 with a built-in Zener diode, a control IC chip 104, and a capacitor 105 are provided on the pedestal 102.

In addition, a lead electrode (second electrode surface portion, second external electrode) 107 and a lead (second external electrode) 107 L for connecting the lead electrode to the outside are provided on the MOSFET chip 103 with the built-in Zener diode.

It is to be noted that the base electrode 101 and the pedestal 102 (first electrode surface portion) serve as the first external electrode. In addition, the lead 107L and the lead electrode 107 (second electrode surface portion) serve as the second external electrode.

It is to be noted that the "MOSFET chip with the built-in Zener diode" is also referred to as "MOSFET chip" as appropriate.

The MOSFET chip 103 with the built-in Zener diode (MOSFET chip) is disposed between the pedestal 102 (first electrode surface portion) and the lead electrode 107 (second electrode surface portion) via a bonding material 109.

In addition, the control IC chip 104 is disposed on the pedestal 102 via the bonding material 109 as described above.

In addition, an insulating substrate 106 is disposed on the pedestal 102 via the bonding material 109.

In addition, an electrode 112 and an electrode 113 are provided on the insulating substrate 106. The electrode 110 and the electrode 111 of the capacitor 105 are arranged on the electrode 112 and the electrode 113, respectively, via the bonding material 109.

In addition, the MOSFET chip 103, the control IC chip 104, and the capacitor 105 on the base electrode 101 and the pedestal 102 are covered with a resin 108.

The Zener diode is included in the MOSFET chip 103 with the built-in Zener diode, and will be described later with reference to FIGS. 4 and 5.

<<Connection Between MOSFET Chip With Built-in Zener Diode, Control IC Chip And Capacitor>>

Next, a connection relationship between the MOSFET chip 103 with the built-in Zener diode (MOSFET chip), the control IC chip 104 and the capacitor 105 will be described with reference to FIGS. 1 to 3.

First, the connection of the MOSFET chip 103 with the built-in Zener diode (MOSFET chip) will be described.

As shown in FIG. 2, a drain electrode 221 (FIGS. 5 and 6) provided on a lower surface of the MOSFET chip 103 is electrically and thermally connected to the pedestal 102 of the base electrode 101 by the bonding material 109.

In addition, a source electrode 220 (FIGS. 5 and 6) provided on an upper surface of the MOSFET chip 103 is electrically and thermally connected to the lead electrode 107 by the bonding material 109.

In addition, as shown in FIG. 1, a gate electrode 103g on the upper surface of the MOSFET chip 103 is electrically connected to a first electrode 104a provided on an upper surface of the control IC chip 104 by a wire 115.

Next, the connection of the capacitor 105 will be described.

As shown in FIGS. 1 and 3, the capacitor 105 is fixed to the pedestal 102 of the base electrode 101 via the insulating substrate 106 by the bonding material 109.

The electrode 110 on a high voltage side of the capacitor 105 is connected to the first electrode 112 provided on an upper surface of the insulating substrate 106 by the bonding material 109. In addition, the first electrode 112 is connected to a second electrode 104b provided on the upper surface of the control IC chip 104 by the wire 115.

The electrode 111 on a low voltage side of the capacitor 105 is connected to the second electrode 113 provided on the upper surface of the insulating substrate 106 by the bonding material 109. In addition, the second electrode 113 is connected to the source electrode 220 (FIGS. 5 and 6) of the MOSFET chip 103 by the wire 115.

Next, the connection of the control IC chip 104 will be described.

As described above, the first electrode 104a provided on the upper surface of the control IC chip 104 is electrically connected to the gate electrode 103g provided on the upper surface of the MOSFET chip 103 by the wire 115.

In addition, as described above, the second electrode 104b provided on the upper surface of the control IC chip 104 is electrically connected to the first electrode 112 of the capacitor 105 by the wire 115.

Further, a third electrode 104c provided on the upper surface of the control IC chip 104 is electrically connected to the source electrode 220 (FIGS. 5 and 6) of the MOSFET chip 103 by the wire 115.

In addition, a fourth electrode 104d provided on the upper surface of the control IC chip 104 is electrically connected to the pedestal 102 of the base electrode 101 by the wire 115.

<<Circuit Configuration of Semiconductor Device (Rectifier Element) 100>>

Next, the circuit configuration of the semiconductor device (rectifier element) 100 will be described.

FIG. 4 is a diagram showing an example of the circuit configuration of the semiconductor device 100 according to the first embodiment of the present invention.

In FIG. 4, the semiconductor device (rectifier element) 100 is configured to include the MOSFET chip 103 with the built-in diode (MOSFET chip), the control IC chip 104 and the capacitor 105. In addition, an L terminal is the base electrode 101 (FIG. 2), and an H terminal is the lead 107L (lead electrode 107: FIG. 2).

As shown in FIG. 4, the control IC chip 104 includes a comparator 116, a gate driver 117 and a diode 118.

An inverting input terminal (−) of the comparator 116 is connected to the H terminal, and a non-inverting input terminal (+) thereof is connected to the L terminal.

An output terminal of the comparator 116 is connected to an input terminal of the gate driver 117.

The output terminal of the gate driver 117 is connected to a gate electrode 131g of the MOSFET chip 103 (MOSFET 131).

An anode of the diode 118 for preventing a reverse flow of an electric charge is connected to the H terminal. A cathode of the diode 118 is connected to a power supply terminal of the gate driver 117, a power supply terminal of the comparator 116 and a high voltage side terminal 110 (FIG. 1) of the capacitor 105.

As described above, the high voltage side terminal of the capacitor 105 is connected to the power supply terminal of the comparator 116 and the power supply terminal of the gate driver 117.

Further, the low voltage side terminal 111 (FIG. 1) of the capacitor 105 is connected to the L terminal.

The MOSFET chip 103 with the built-in Zener diode is configured to include the MOSFET 131 and a Zener diode 132. The Zener diode 132 is configured (connected) in an anti-parallel relationship with the MOSFET 131.

A source electrode 131s (220: FIG. 5) of the MOSFET 131 (MOSFET chip 103 with the built-in Zener diode) is connected to the L terminal (FIG. 4).

A drain electrode 131d (221: FIG. 5) of the MOSFET 131 is connected to the H terminal (FIG. 4).

<<Circuit Operation of Semiconductor Device (Rectifier Element) 100>>

A circuit operation of the semiconductor device (rectifier element) 100 shown in FIG. 4 will now be described later.

If the voltage of the H terminal becomes lower than that of the L terminal, the comparator 116 outputs a high voltage signal to the gate driver 121.

The gate driver 117 to which the high voltage signal is input increases the voltage of the gate electrode 131g of the MOSFET 131 (MOSFET chip 103 with the built-in Zener diode) to turn on the MOSFET 131. That is, the semiconductor device (rectifier element) 100 is turned on.

Conversely, if the voltage of the H terminal becomes higher than that of the L terminal, the comparator 116 outputs a low voltage signal to the gate driver 117.

The gate driver 117 to which the low voltage signal is input turns off the MOSFET 131. That is, the semiconductor device (rectifier element) 100 is turned off.

As described above, the comparator 116 compares a magnitude relationship between the voltage of the H terminal and the voltage of the L terminal to turn on/off the MOSFET 131 (MOSFET chip 103 with the built-in Zener diode) by the gate driver 117. That is, the semiconductor device (rectifier element) 100 is turned on/off. That is, an operation as the rectifier element is performed.

In FIG. 4, the capacitor 105 plays a role of supplying the power supply voltage (electric power) to the comparator 116 and the gate driver 117 by the stored charge.

<<Structure of MOSFET Chip 103 with Built-in Zener Diode>>

Next, the structure of the MOSFET chip 103 with the built-in Zener diode will be described with reference to FIGS. 5 and 6.

FIG. 5 is a diagram showing an example of a cross section structure of a unit cell of the MOSFET with the built-in Zener diode in the active region of the MOSFET chip 103 with the built-in Zener diode according to the first embodiment of the present invention.

FIG. 6 is a diagram showing an example of a cross section structure of a peripheral region including a part of the active region of the MOSFET chip 103 with the built-in Zener diode according to the first embodiment of the present invention.

The active region 103a (FIGS. 1 and 6) in which a current flows and a peripheral region 103t (FIGS. 1 and 6) for holding a breakdown voltage at the periphery exist in the MOSFET chip 103 with the built-in Zener diode. Next, the cross section structure of the unit cell of the active region and the cross section structure of the peripheral region will be described in order.

<<Cross Section Structure of Unit Cell of Active Region>>

As described above, FIG. 5 is a diagram showing an example of a cross section structure of a unit cell 290 of the MOSFET with the built-in Zener diode in the active region of the MOSFET chip 103 with the built-in Zener diode according to the first embodiment of the present invention.

In FIG. 5, an $n^-$ epitaxial layer 202 (second semiconductor layer) is formed on an $n^+$ substrate 201 (first semiconductor layer) (upper part when viewed from a space) which is one semiconductor surface. A p channel layer 203 (third semiconductor layer) is formed on the $n^-$ epitaxial layer 202. In addition, an $n^+$ source layer 204 (fourth semiconductor layer) which is another semiconductor surface is formed on the p channel layer 203. In addition, an n type semiconductor layer is appropriately expressed as a first conductivity type, and a p type semiconductor layer is appropriately expressed as a second conductivity type.

The $n^+$ substrate 201 is in contact with the drain electrode 221 of metal (metal containing material) to be the drain of the MOSFET (MOSFET 131: FIG. 4). The $n^+$ substrate 201 and the drain electrode 221 of metal are in ohmic contact with each other.

In addition, the $n^+$ source layer 204 is in contact with the source electrode 220 of metal (metal containing material) to be the source of the MOSFET. The $n^+$ source layer 204 and the source electrode 220 of metal are in ohmic contact with each other.

It is to be noted that an interlayer insulating film 214 is formed between the source electrode 220 of metal and the $n^+$ source layer 204.

In addition, a contact trench 213 (second trench portion) which penetrates through the interlayer insulating film 214 and the n+ source layer 204 and reaches the p channel layer 203 is formed, and the source electrode 220 of metal reaches the n+ source layer 204 and the p+ contact layer 205 formed in a part of the p channel layer 203. Since an impurity concentration of the p+ contact layer 205 is high, the source electrode 220 of metal and the p+ contact layer 205 are in ohmic contact with each other. The potential of the p+ contact layer 205 is gradually transferred to the p channel layer 203.

In addition, a trench gate 210 (first trench portion) which penetrates through the p channel layer 203 from the semiconductor surface on the n+ source layer 204 side and reaches the n− epitaxial layer 202 is formed.

The trench gate 210 is configured to have a gate oxide film 211 and a polysilicon electrode 212 filled in the trench.

In the configuration of FIG. 5, the n+ source layer 204 connected to the source electrode 220 corresponds to the source of the MOSFET, the p channel layer 203 corresponds to the channel of the MOSFET, the n− epitaxial layer 202, the n+ substrate 201 and the drain electrode 221 correspond to the drain of the MOSFET, and the polysilicon electrode 212 corresponds to the gate of the MOSFET.

That is, the source electrode 220 and the drain electrode 221 are turned on/off (ON/OFF) as the MOSFET depending on whether the potential of the gate of the polysilicon electrode 212 is a high potential (High) or a low potential (Low).

In addition, the Zener diode 230 is configured at a boundary (boundary surface) between the p channel layer 203 and the n− epitaxial layer 202.

The Zener diode 230 of FIG. 5 corresponds to the Zener diode 132 of FIG. 4, and is formed in anti-parallel to the MOSFET (131: FIG. 4).

In FIG. 5, the Zener diode 230 is schematically expressed as a general symbol of the Zener diode. A schematic symbol in a cross-sectional view is used to emphasize that the bonding surface between the p channel layer 203 and the n− epitaxial layer 202 has a function of an element as the Zener diode 230.

In addition, in FIG. 5, a distance from the Zener diode 230 to an upper side (upper side when viewed from the space) of the source electrode 220 is defined as L. After the MOSFET 103 with the built-in Zener diode is mounted, since the surface of the upper side of the source electrode 220 is the bonding material 109, the L corresponds to the distance from the Zener diode 230 to the bonding material 109.

<<Cross Section Structure of Peripheral Region Including Part of Active Region>>

As described above, FIG. 6 is a diagram showing the cross section structure of the peripheral region including a part of the active region of the MOSFET chip 103 with the built-in Zener diode according to the first embodiment of the present invention.

In FIG. 6, a left side viewed from the space shown by a boundary line 2001 is an active region where a circuit current flows, and a right side viewed from the space is a peripheral region where a breakdown voltage is maintained in a peripheral portion. It is noted to be that the boundary line 2001 in FIG. 6 is the boundary line 2001 in FIG. 1. In addition, the active region in FIG. 6 shows an inner side of the boundary line 2001 in FIG. 1. In addition, the peripheral region in FIG. 6 is a region between an end portion of the MOSFET chip 103 with the built-in Zener diode and the boundary line 2001 in FIG. 1.

In FIG. 6, the source electrode 220, a guard ring 222, interlayer insulating film 214, a deep p layer 208, a channel stopper layer 209, the n− epitaxial layer 202, the n+ substrate 201, and the drain electrode 221 are provided in the peripheral region.

As shown in FIG. 6, the deep p layer 208 exists in the peripheral region, and a depletion layer extends to the outer periphery at the time of applying a voltage to ensure a breakdown voltage.

In addition, the source electrode 220 extends to a position where the deep p layer 208 is covered, and serves as a field plate. An electric field at an end portion of the deep p layer 208 is relaxed.

In addition, the n+ channel stopper layer 209 and the guard ring 222 exist at an end portion of the chip to prevent the depletion layer from arriving at the end portion of the chip with many defects and short lifetime and maintain the breakdown voltage.

In the active region on the left side when viewed from the surface shown by the boundary line 2001 in FIG. 6, a plurality of unit cells 290 of the MOSFET with the built-in Zener diode are arranged continuously.

In addition, as shown in FIG. 5, the Zener diode 230 is provided at a pn junction between the p channel layer 203 and the n− epitaxial layer 202 of the unit cell 290 of the MOSFET with the built-in Zener diode in which the MOSFET (131: FIG. 4) is formed. (However, for convenience, the Zener diode 230 is omitted in FIG. 6).

That is, the MOSFET (131: FIG. 4) and the Zener diode 230 coexist in the same region of the unit cell 290 of the MOSFET with the built-in Zener diode.

Therefore, compared with the case in which the Zener diode is built in a region different from the active region of the MOSFET, it is possible to increase the region of the MOSFET and the Zener diode.

In addition, it is possible to increase the capacity of the alternator while achieving both the low ON resistance of the MOSFET and the high surge absorption effect by the Zener diode.

In addition, since the Zener diode 230 can be disposed over the whole of the active regions in the chip, it is possible to make the temperature rise at the time of the surge absorption uniform.

In addition, it is possible to disperse heat even to a portion where the Zener diode is not provided in the vicinity of the trench gate 210. In addition, it is possible to make the temperature of the active region uniform.

Therefore, it is possible to suppress the temperature rise of the MOSFET (MOSFET chip) as compared with the case in which the Zener diode is locally provided.

In addition, since the Zener diode 230 exists at a central part of the pn junction and is provided directly under the contact trench 213, the current flowing when the Zener diode 230 is avalanched easily flows in the contact layer 205. Therefore, a current passing through the lower part of the n+ source layer 204 decreases, so that an operation of a parasitic npn transistor can be prevented, and a high avalanche resistance can be realized.

<<Effect of Surge Voltage Due to Load Dump>>

Next, the effect of the surge voltage due to the load dump in the MOSFET will be described with reference to FIGS. 7 and 8.

Figure 7:
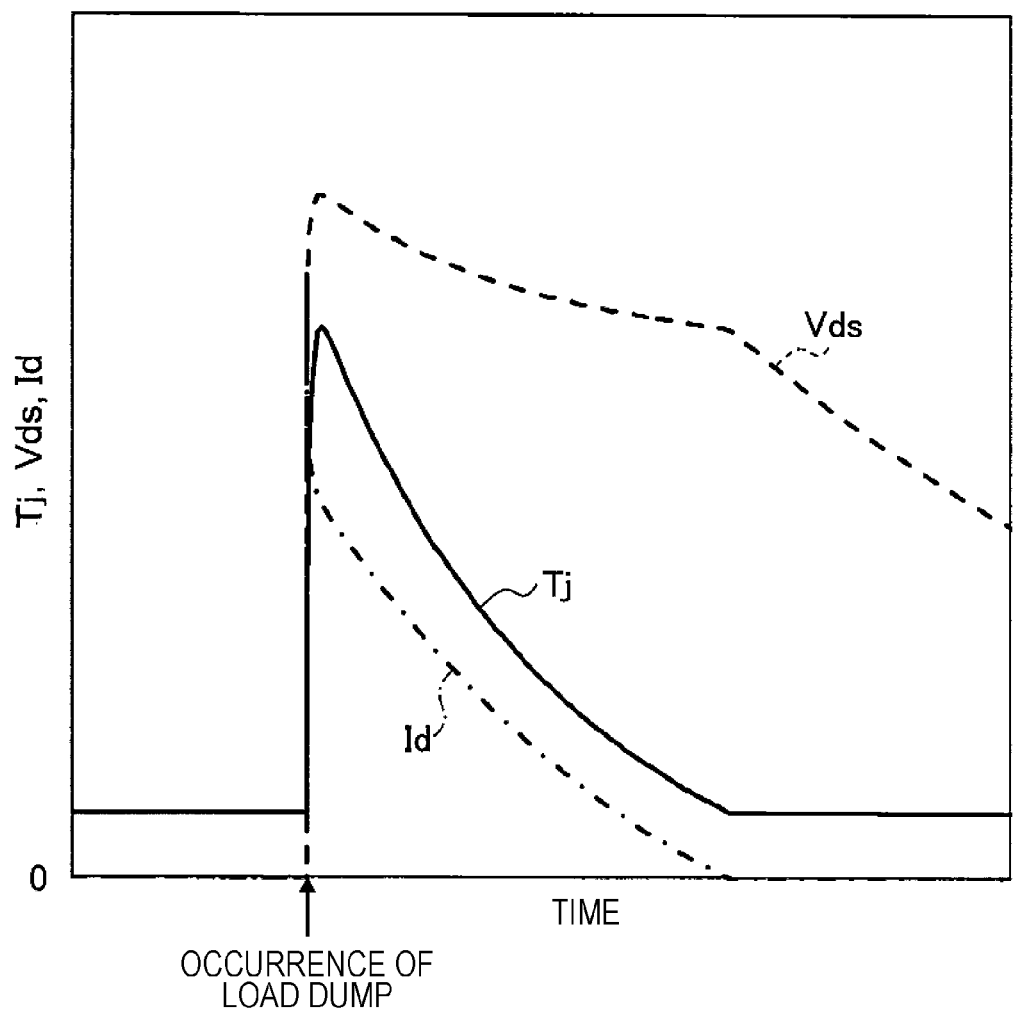
FIG. 7 is a diagram showing an example of a relationship between a drain-source voltage of the MOSFET, a drain current and a maximum temperature inside the MOSFET when a load dump occurs and a surge voltage is applied to the drain of the MOSFET.

FIG. 7 is a diagram showing an example of the relationship between a drain-source voltage Vds, a drain current Id, and a maximum temperature Tj inside the MOSFET of the MOSFET with the built-in Zener diode when the load dump occurs and the surge voltage is applied to the drain of the MOSFET.

In FIG. 7, a horizontal axis represents time (change in time), and a vertical axis represents Vds (voltage), Id (current), and Tj (temperature), with ignoring a difference in a unit system.

As shown in FIG. 7, if the surge voltage is applied by the occurrence of the load dump, the MOSFET undergoes avalanche breakdown and a large current Id flows under a high voltage, such that the temperature Tj inside the device rises. With the change in time, the surge voltage is eliminated and the drain-source voltage Vds and the drain current Id of the MOSFET decrease, such that the maximum temperature Tj inside the MOSFET also decreases.

Figure 8:
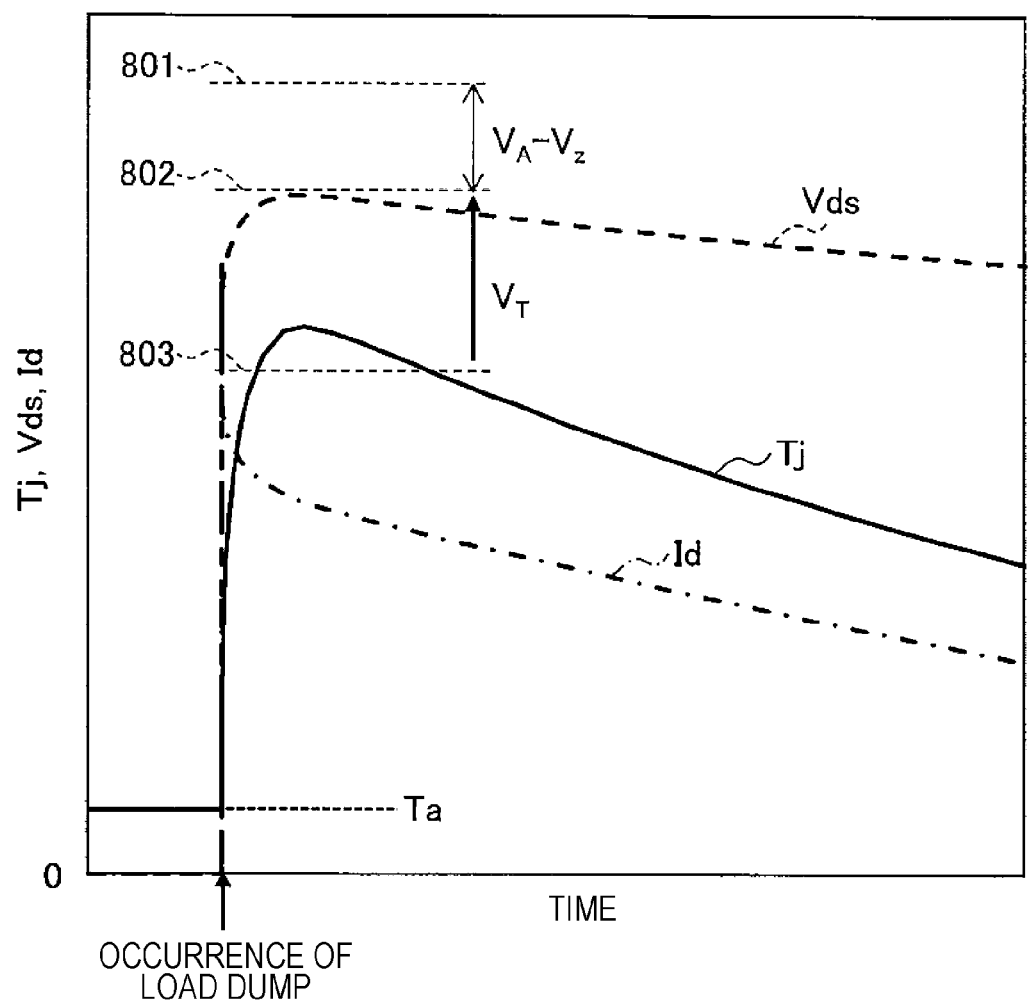
FIG. 8 is a diagram showing an example of an enlarged waveform near time when the load dump in FIG. 7 occurs and a relationship between an increase in breakdown voltage and an increase in breakdown voltage of a peripheral portion and breakdown voltage of the MOSFET with the built-in Zener diode according to a temperature rise of the MOSFET with the built-in Zener diode.

FIG. 8 is an enlarged view of a waveform near time when the load dump in FIG. 7 occurs and is a diagram showing an example of the relationship between an increase in breakdown voltage $V_T$ and an increase in breakdown voltage $V_A$ of a peripheral portion (peripheral region) and breakdown voltage $V_Z$ of the MOSFET with the built-in Zener diode according to a temperature (Tj) rise of the MOSFET with the built-in Zener diode.

In FIG. 8, a potential (voltage) of a dashed line denoted by reference numeral 801 indicates the breakdown voltage $V_A$ of the peripheral portion, and a potential (voltage) of a dashed line denoted by reference numeral 802 indicates the breakdown voltage $V_Z$ of the MOSFET with the built-in Zener diode whose temperature rises. In addition, the breakdown voltage of the MOSFET with the built-in Zener diode before the temperature of the potential (voltage) of the dashed line indicated by reference numeral 803 rises is shown.

In addition, a difference between the potential (voltage) of the dashed line denoted by reference numeral 803 and the potential (voltage) of the dashed line denoted by the reference numeral 802 indicates the breakdown voltage $V_T$ increased as the temperature of the MOSFET with the built-in Zener diode rises.

It is to be noted that since Vds, Id, Tj, the horizontal axis, and the vertical axis are the same as FIG. 7, the duplicate descriptions are omitted.

In FIG. 8, if the surge voltage is applied as in FIG. 7, the MOSFET undergoes the avalanche breakdown and the large current flows under the high voltage, such that the temperature Tj inside the device rises.

If the bonding material which bonds the MOSFET and the electrode exceeds its melting point due to this temperature rise, the bonding becomes insufficient and the thermal resistance increases, thereby causing the problem that the device is thermal runaway to be destroyed.

In addition, since the MOSFET is not broken in the state in which the high voltage and the large current are applied, the MOSFET not only requires the high avalanche resistance, but also the MOSFET needs to be avalanched ($V_Z$) in the active region even if the breakdown voltage $V_T$ increases as the temperature of the MOSFET rises.

When the breakdown voltage in the peripheral region of the MOSFET becomes lower than that of the active region, the high voltage and the large current flow in the peripheral region, and as a result, the device is likely to be destroyed.

In addition, as shown in FIG. 8, the breakdown voltage $V_Z$ of the Zener diode 230 is set to be lower than the breakdown voltage $V_A$ of the peripheral region.

When the load dump occurs, the Zener diode 230 is avalanched and the breakdown voltage $V_T$ of the Zener diode 230 increases with the temperature rise (Tj) of the active portion. Since the peripheral region is away from the active portion, the temperature rise of the peripheral region is smaller than that of the active portion, but when the load dump occurs, the surge energy can be reliably absorbed by the Zener diode 230. That is, even when the temperature rises, the breakdown voltage of the Zener diode 230 is set to be lower than the breakdown voltage of the peripheral region.

That is, in FIG. 8, the breakdown voltage of the Zener diode 230 denoted by reference numeral 803 increases with the temperature rise, and even if the breakdown voltage increases ($V_T$) as denoted by reference numeral 802, as denoted by reference numeral 801, the breakdown voltage of the peripheral region needs to be set to be higher than the breakdown voltage denoted by reference numeral 802.

That is, the breakdown voltage $V_A$ of the peripheral portion is set to be larger than the breakdown voltage $V_Z$ of the Zener diode at the time of the temperature rise. That is, $V_A - V_Z > 0$.

In addition, considering the characteristics and measures at the time of the load dump as described above, in FIG. 1, the MOSFET chip 103, the control IC chip 104 and the capacitor 105 can be easily connected to each other by the wire or the chip size of the MOSFET increases, thereby coping with, for example, the increase in capacity of the alternator.

That is, it is preferable to make the shape of the MOSFET chip 103 rectangular, and arrange the control IC 104 and the capacitor 105 along the long side direction of the rectangle.

<<Relationship Between Area a of Active Region and Temperature Rise ΔT of Bonding Material of MOSFET>>

Figure 9:
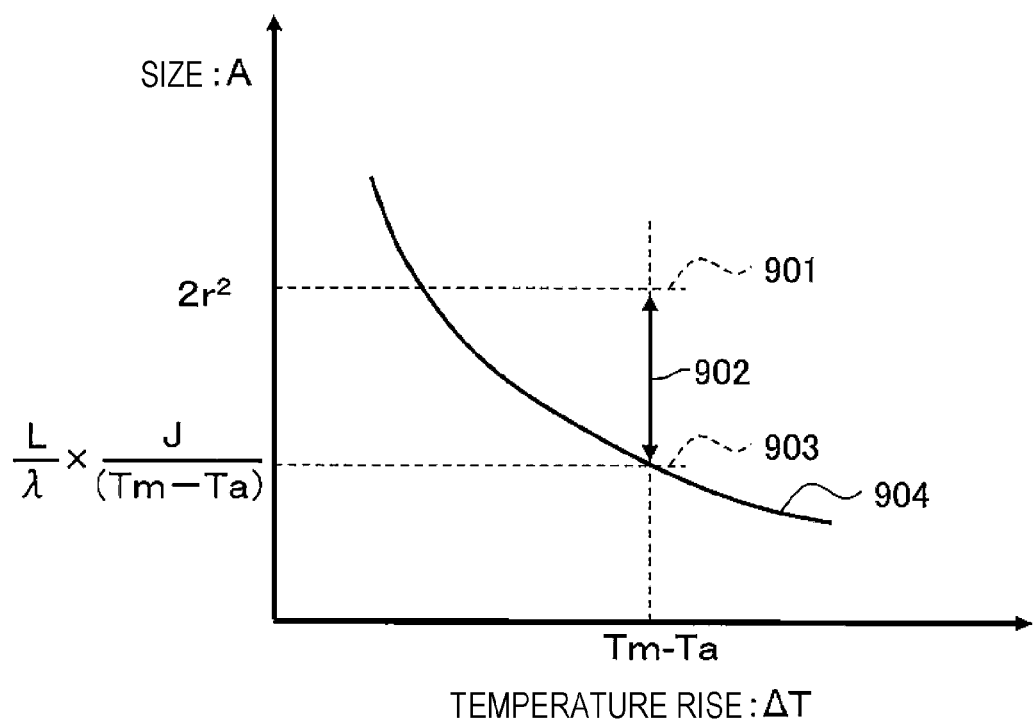
FIG. 9 is a diagram showing an example of a relationship between an area of the active region of the MOSFET chip with the built-in Zener diode at the time of the generation of surge due to the occurrence of the load dump or the like and a temperature rise of a bonding material for bonding the MOSFET chip with the built-in Zener diode and an electrode.

FIG. 9 is a diagram showing an example of the relationship between an area A of the active region of the chip at the time of the occurrence of the surge due to the occurrence of the load dump and a temperature rise ΔT of the bonding material bonding the MOSFET chip with the built-in Zener diode and the electrode.

In FIG. 9, a horizontal axis represents the temperature rise ΔT of the MOSFET chip with the built-in Zener diode, and a vertical axis represents the size A which is the area of the active region of the MOSFET chip with the built-in Zener diode.

In addition, when the load dump occurs and surge energy J is applied to the Zener diode in unit time, the temperature rise of the active region where the Zener diode is formed is uniform. In addition, if the whole heat is delivered to the bonding material, Equation 1 of the following relational expression is established between the size (area) A and the temperature rise ΔT.

[Equation 1]

$$J = \left(\frac{\lambda}{L}\right) \times A \times \Delta T \quad (1)$$

In the above Equation 1, λ indicates the thermal conductivity of the MOSFET chip 103 in the mounted state, and L is the distance from the Zener diode 230 to the bonding material 109. Although the actual heat path is complicated, for example, L shown in FIG. 5 is the distance from the Zener diode 230 to the bonding material 109.

In addition, in order to set the ambient temperature of the semiconductor device (rectifier element) 100 to be Ta and prevent the temperature T of the bonding material 109 from being higher than the melting point Tm, it is necessary to satisfy the following Equation 2.

[Equation 2]

$$\Delta T < Tm - Ta \quad (2)$$

In addition, depending on the above Equations 1 and 2, the area A of the active region required at the time of the surge absorption is represented by the following Equation 3.

[Equation 3]

$$A > \frac{L}{\lambda} \times \frac{J}{(Tm - Ta)} \quad (3)$$

FIG. 9 shows the above Equation 3, in which as the area A of the active region, that is, the chip size of the MOSFET chip 103 with the built-in Zener diode increases, the temperature rise is suppressed. That is, if the chip size increases, the larger surge energy can be absorbed, such that it is possible to increase the capacity of the alternator using the MOSFET chip 103 with the built-in Zener diode.

However, the maximum size of the MOSFET chip 103 with the built-in Zener diode is a size that can be mounted on a circular package. Therefore, when the MOSFET chip is rectangular and a radius of the pedestal of the circular package is r, the maximum mountable area is $2r^2$. Therefore, the area (A) of the active region of the MOSFET chip with the built-in Zener diode is expressed by the following Equation 4.

[Equation 4]

$$2r^2 > A > \frac{L}{\lambda} \times \frac{J}{(Tm - Ta)} \quad (4)$$

<<When Largest MOSFET with Built-in Zener Diode is Mounted>>

Figure 10:
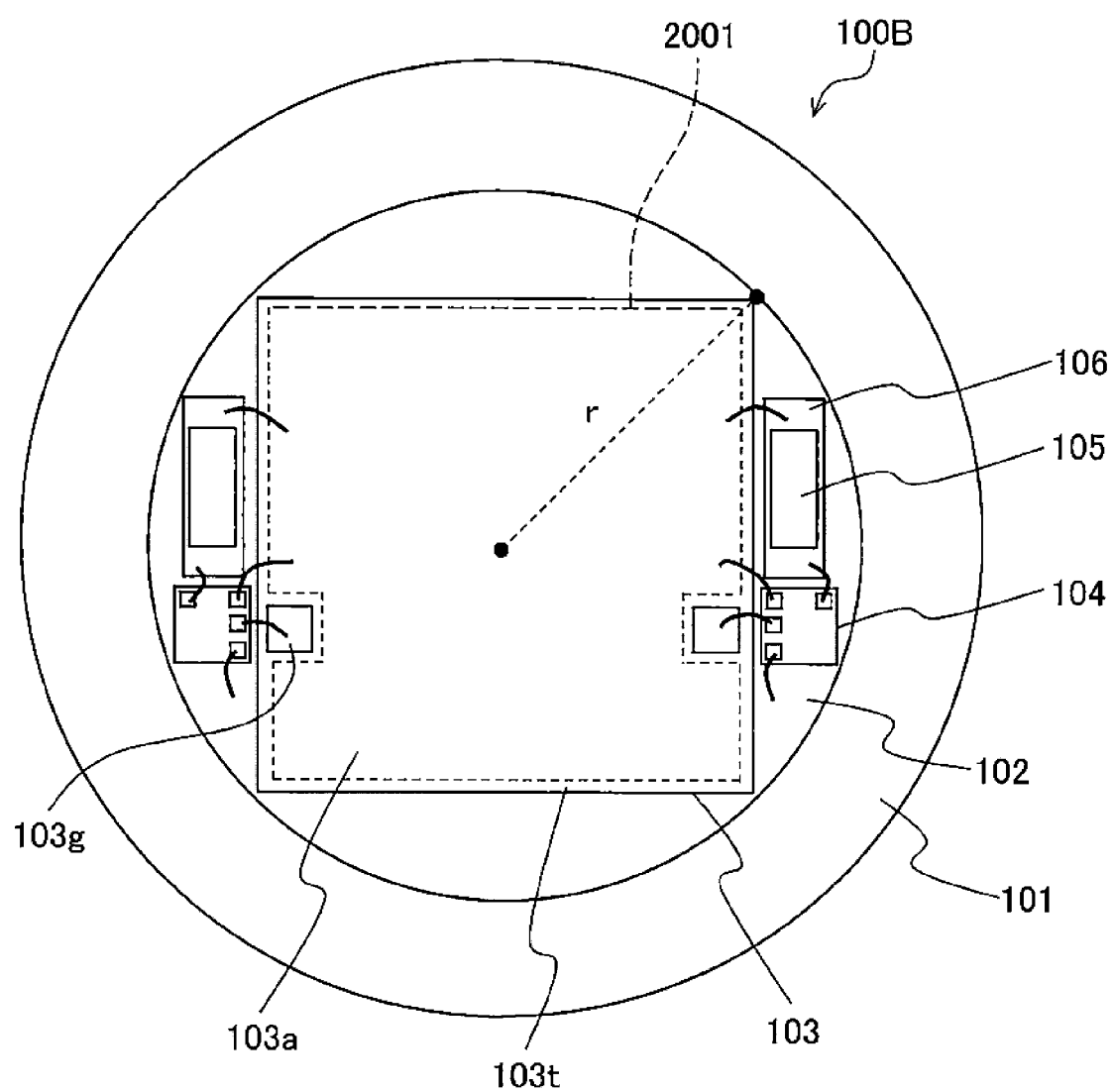
FIG. 10 is a diagram showing an example of a planar structure of a rectifier element when the largest MOSFET chip with a built-in Zener diode is mounted according to the first embodiment of the present invention is mounted.

FIG. 10 is a diagram showing an example of a planar structure of a semiconductor device (rectifier element) 100B when the largest MOSFET chip with the built-in Zener diode according to the first embodiment of the present invention is mounted.

In FIG. 10, the control IC chip 104 and the capacitor 105 are disposed on the pedestal 102 at a gap of the MOSFET chip (MOSFET chip) 103 with the built-in Zener diode.

As the size of the MOSFET chip 103 increases, the size of the control IC chip 104 or the capacitor 105 decrease. Therefore, there is a risk that the driving of the MOSFET chip 103 or the capacitance of the capacitor 105 as the power supply is insufficient. However, for example, as shown in FIG. 10, it is possible to sufficiently drive the MOSFET chip 103 by providing the plurality of control IC chips 104 and the plurality of capacitors 105.

With such a configuration, it is possible to increase the chip size of the MOSFET chip 103 with the built-in Zener diode and increase the capacity of the alternator.

In addition, it is possible to absorb the surge energy larger than the chip size of the same MOSFET chip with the built-in Zener diode and increase the capacity of the alternator by using the bonding material having a high melting point, for example, a bonding material using sintered bonding having a high melting point with respect to solder.

Effect of First Embodiment

As described above, the semiconductor device (rectifier element) 100 according to the first embodiment has the following effects.

Since the MOSFET (131: FIG. 4) and the Zener diode 230 coexist in the same region of the unit cell 290 of the MOSFET with the built-in Zener diode, compared with the case in which the Zener diode is built in a region different from the active region of the MOSFET chip, it is possible to increase the region of the MOSFET and the Zener diode.

In addition, it is possible to increase the capacity of the alternator while achieving both the low ON resistance of the MOSFET and the high surge absorption effect by the Zener diode.

In addition, since the Zener diode 230 can be disposed over the whole of the active region in the chip, it is possible to make the temperature rise at the time of the surge absorption uniform.

In addition, since heat can be dispersed even to the portion where the Zener diode is not provided in the vicinity of the trench gate 210 and the temperature of the active region can be uniform, compared with the case in which the Zener diode is locally provided, it is possible to suppress the temperature rise of the MOSFET (MOSFET Chip).

In addition, since the Zener diode 230 exists at a central part of the pn junction and is provided directly under the contact trench 213, the current flowing when the Zener diode 230 is avalanched easily flows in the $P^+$ contact layer 205. Therefore, a current passing through the lower part of the $n^+$ source layer 204 decreases, so that the operation of the parasitic npn transistor can be prevented, and the high avalanche resistance can be realized.

Compared with the MOSFET with the built-in Zener diode in which the Zener diode is disposed at different positions with respect to the MOSFET in plan view, the MOSFET chip with the built-in Zener diode of the first embodiment can absorb the larger surge energy, so that it is possible to provide the semiconductor device (rectifier element) 100 suitable to increase the capacity of the alternator.

In addition, it is possible to provide the structure of the MOSFET chip with the built-in Zener diode and the size of the active region which are suitable to absorb the surge energy generated when the load dump occurs.

Second Embodiment

Next, a configuration of a semiconductor device (Rectifier Element) 200 according to a second embodiment of the present invention will be described with reference to FIGS. 11 to 13.

Figure 11:
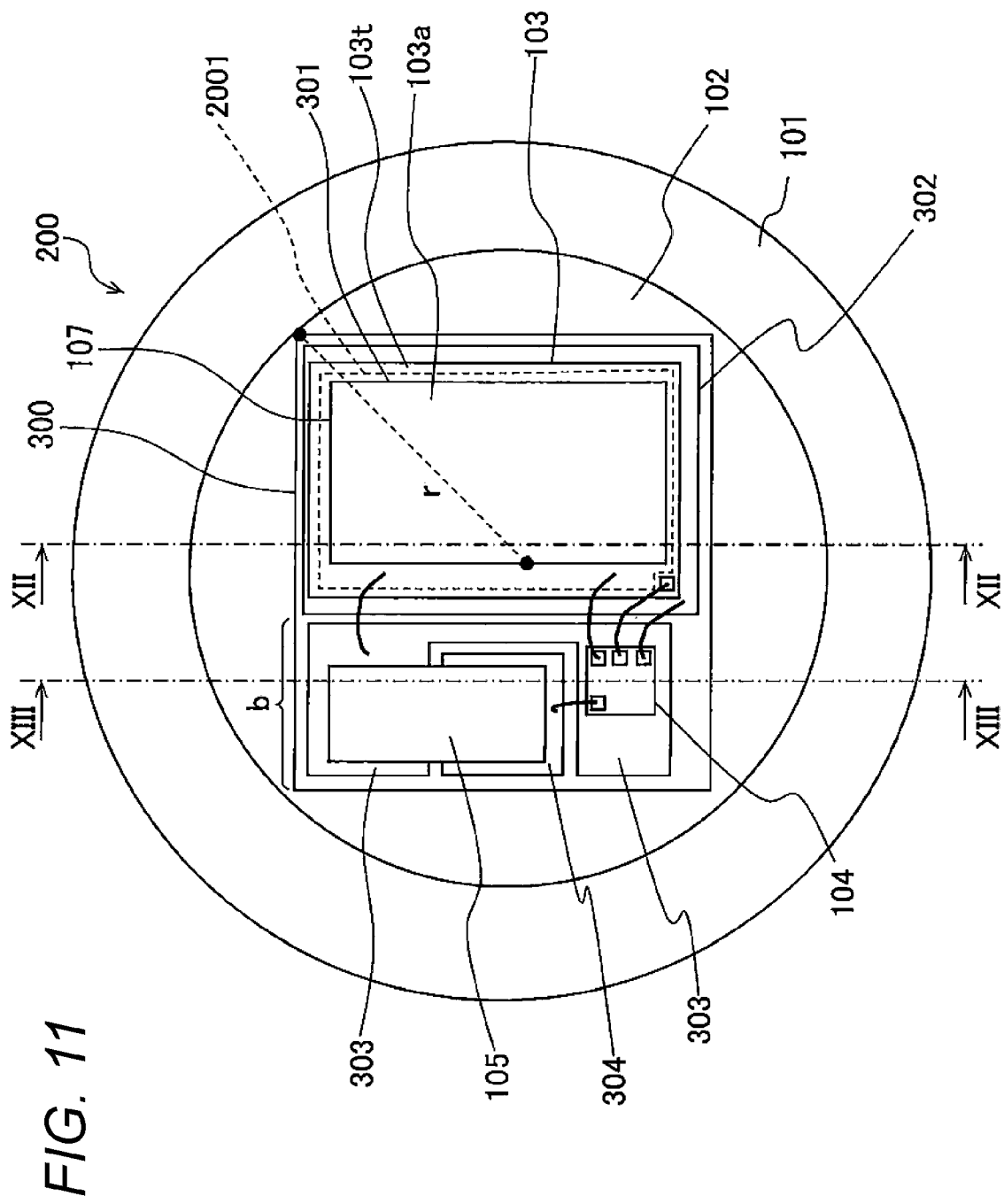
FIG. 11 is a diagram showing an example of a planar structure of a semiconductor device according to a second embodiment of the present invention.

FIG. 11 is a diagram schematically showing an example of a planar structure of a semiconductor device 200 according to a second embodiment of the present invention. For ease of understanding, a lead 107L and a resin 108 which are arranged on an upper part of the semiconductor device 200 are not shown in FIG. 11.

Figure 12:
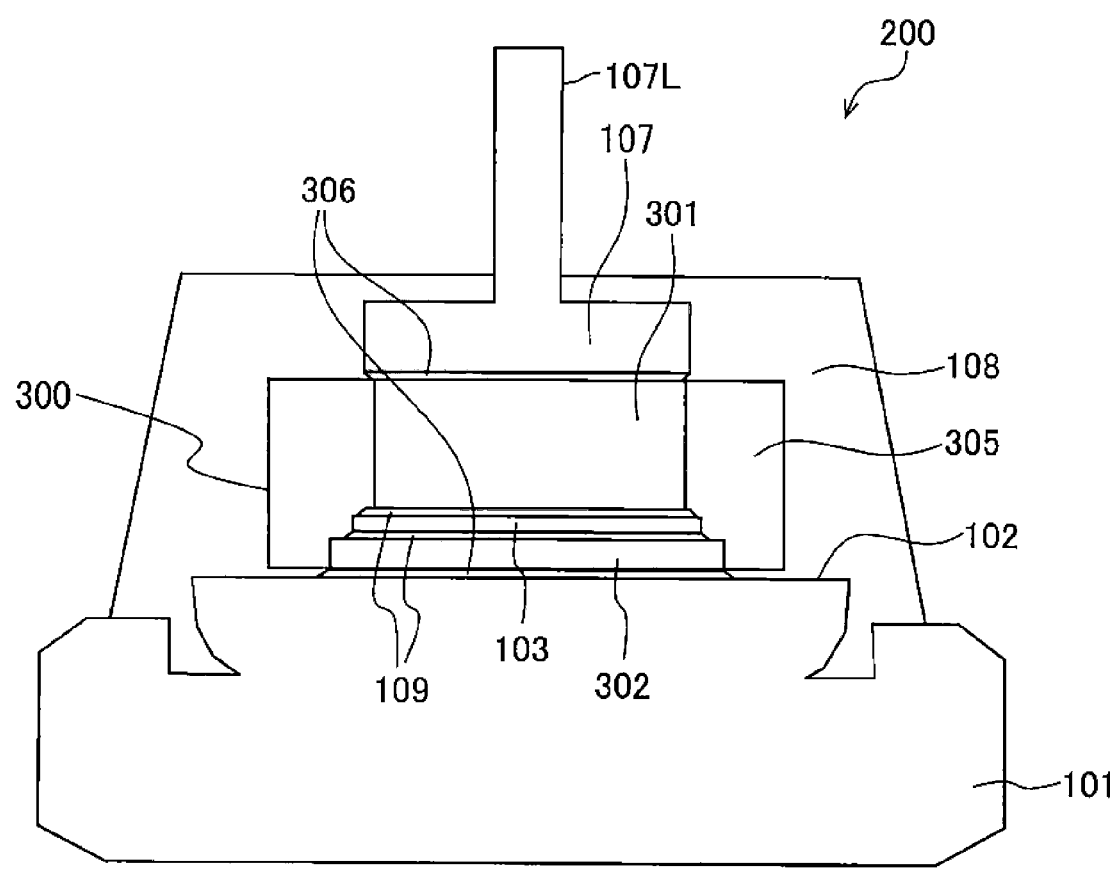
FIG. 12 is a diagram schematically showing an example of a cross section structure of XII-XII shown in FIG. 11 of the semiconductor device according to the second embodiment of the present invention.

FIG. 12 is a diagram schematically showing an example of a cross section structure of XII-XII shown in FIG. 11 of the semiconductor device 200 according to the second embodiment of the present invention.

Figure 13:
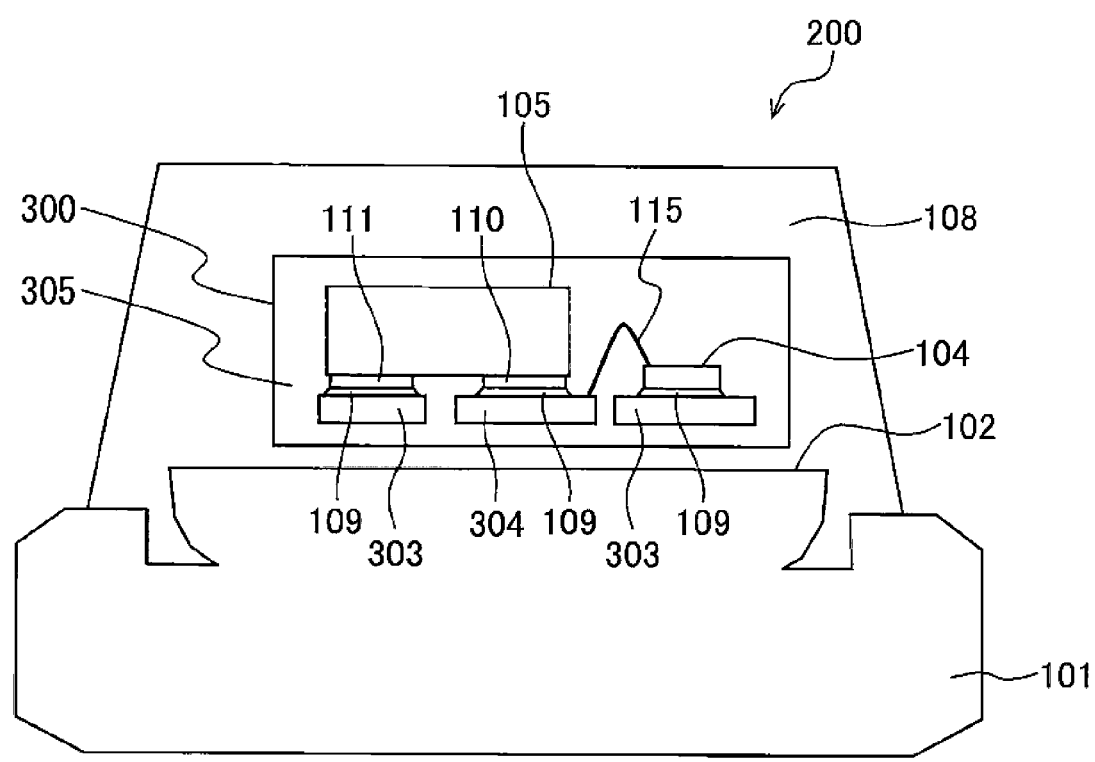
FIG. 13 is a diagram schematically showing an example of a cross section structure of XIII-XIII shown in FIG. 11 of the semiconductor device according to the second embodiment of the present invention.

FIG. 13 is a diagram schematically showing an example of a cross section structure of XIII-XIII shown in FIG. 11 of the semiconductor device 200 according to the second embodiment of the present invention.

In characteristics of the semiconductor device (rectifier element) 200 according to the second embodiment, a MOSFET chip 103 with a built-in Zener diode, a control IC chip 104 and a capacitor 105 are used while being housed in a rectangular inner package 300 as an electronic circuit body 300. In addition, for convenience of connection and bonding, the electronic circuit body (inner package) 300 includes a source frame 301 and a drain frame 302.

<<Electronic Circuit Body (Internal Package) 300>>

As shown in FIGS. 11 to 13, the electronic circuit body (inner package) 300 is configured to include the MOSFET chip 103 with the built-in Zener diode, the control IC chip 104, the capacitor 105, the source frame 301, the drain frame 302, lead frames 303 and 304, and a resin 305.

As shown in FIGS. 12 and 13, the MOSFET chip 103 with the built-in Zener diode is mounted on the drain frame 302. The source frame 301 is mounted on the MOSFET chip 103 with the built-in Zener diode.

The control IC chip 104 and the capacitor 105 are mounted on the lead frames 303 and 304.

In addition, as shown in FIGS. 12 and 13, the resin 305 protects the MOSFET chip 103 with the built-in Zener diode, the control IC chip 104, the capacitor 105, the source frame 301, the drain frame 302, the lead frames 303 and 304 to protect the electronic circuit body (inner package) 300.

It is to be noted that an upper surface of the source frame 301 and a lower surface of the drain frame 302 are not covered with the resin 305, but are exposed on the surface of the electronic circuit body (inner package) 300.

The upper surface of the source frame 301 (the second surface of the electronic circuit body 300) is connected to the lead electrode 107 by a bonding material 306. In addition, the lower surface of the drain frame 302 (the first surface of the electronic circuit body 300) is connected to a pedestal 102 by the bonding material 306.

As shown in FIGS. 11 and 13, the control IC chip 104 and the electrode 111 on a low voltage side of the capacitor 105 are connected to the same lead frame 303.

The electrode 110 on the high voltage side of the capacitor 105 is connected to the lead frame 304.

As described above, in the semiconductor device (rectifier element) 200 according to the second embodiment, the MOSFET 103 with the built-in Zener diode, the control IC chip 104 and the capacitor 105 are used while being housed in the rectangular inner package 300 as the electronic circuit body 300. The internal package 300 is provided with the source frame 301 and the drain frame 302 and for example, even if the upper and lower directions are reversed, can be electrically connected as it is as the electronic circuit body (internal package) 300 and thus is easily handled.

For the rectifier element (semiconductor device) used for the alternator, a forward side structure and a reverse side structure having different current directions are required. For example, in FIG. 17 to be described later, the semiconductor device (rectifier element) 100 has a forward side structure, whereas a semiconductor device (rectifier element) 500 has a reverse side structure.

The semiconductor device (rectifier element) 100 shown in the first embodiment or the semiconductor device (rectifier element) 200 shown in the second embodiment have the forward side structure. In contrast, the reverse side structure in which the drain electrode of the MOSFET (MOSFET chip 103 with the built-in Zener diode) is connected to the lead electrode 107 and the source electrode is connected to the pedestal 102 is also required.

In the structure of the first embodiment, in order to manufacture the reverse side structure, it is necessary to prepare the connection and the like of each chip (the MOSFET chip 103 with the built-in Zener diode, the control IC chip 104 and the capacitor 105) in a separate process, and there is a problem in terms of manufacturing equipment and cost.

In the case of using the electronic circuit body (internal package) 300 of the second embodiment, it is possible to commonly use the electronic circuit body (internal package) 300 for the forward side structure and the reverse side structure. That is, the source frame 301 of the electronic circuit body (internal package) 300 is connected to the pedestal 102 and the drain frame 302 is connected to the lead electrode 107, such that the reverse side structure can be manufactured. Therefore, it is possible to simply manufacture the forward side structure and the reverse side structure at low cost. It is noted to be that the semiconductor device (rectifier element) having the reverse side structure using the electronic circuit body (internal package) 300 will be described later with reference to FIGS. 15 and 16.

Even in the present (second) embodiment, it is possible to efficiently absorb the surge energy at the time of the load dump by applying the MOSFET chip 103 with the built-in Zener diode.

In addition, even in the present (second) embodiment, the chip area required for absorbing the surge in the active region of the MOSFET chip 103 with the built-in Zener diode is expressed by the above Equation 3.

The maximum size of the MOSFET chip 103 with the built-in Zener diode is maximized when the electronic circuit body (internal package) 300 is square, but is smaller than that of the first embodiment to mount the control IC chip 104 and the capacitor 105 in the internal package (300).

Further, the mounting area of the control IC chip 104 and the capacitor 105 varies depending on the driving MOSFET (MOSFET chip 103 with the built-in Zener diode) and the required power supply capacity.

However, as shown in FIG. 11, if the required length of the mounting portion of the control IC chip 104 and the capacitor 105 is b, it is expressed by the following Equation 5.

[Equation 5]

$$\sqrt{2}\,r \times (\sqrt{2}\,r - b) > A > \frac{L}{\lambda} \times \frac{J}{(Tm - Ta)} \tag{5}$$

In the above Equation 5, for example, b is about $(\frac{1}{3}) \times \vec{2}\,r$. It is to be noted that "$\vec{2}$" in the expression means "root 2" or "$(2)^{1/2}$".

In addition, even in the present (second) embodiment, in the relationship between the MOSFET chip 103 with the built-in Zener diode of the electronic circuit body (internal package) 300, the control IC chip 104 and the capacitor 105, it is preferable to make the MOSFET chip with the built-in Zener diode 103 rectangular and arrange the control IC chip 104 and the capacitor 105 along the long side direction of the rectangle.

The reason is that the MOSFET chip 103 with the built-in Zener diode, the control IC chip 104 and the capacitor 105 can be easily connected to each other by the wire or the size of the MOSFET chip (MOSFET chip 103 with the built-in Zener diode) increases to increase the capacity of the alternator.

Effect of Second Embodiment

In the case of using the electronic circuit body (internal package) 300 of the second embodiment, it is possible to commonly use the electronic circuit body (internal package) 300 for the forward side structure and the reverse side structure.

Therefore, it is possible to simply manufacture the semiconductor device (rectifier element) for an alternator having the forward side structure and the reverse side structure at low cost.

Third Embodiment

Figure 14:
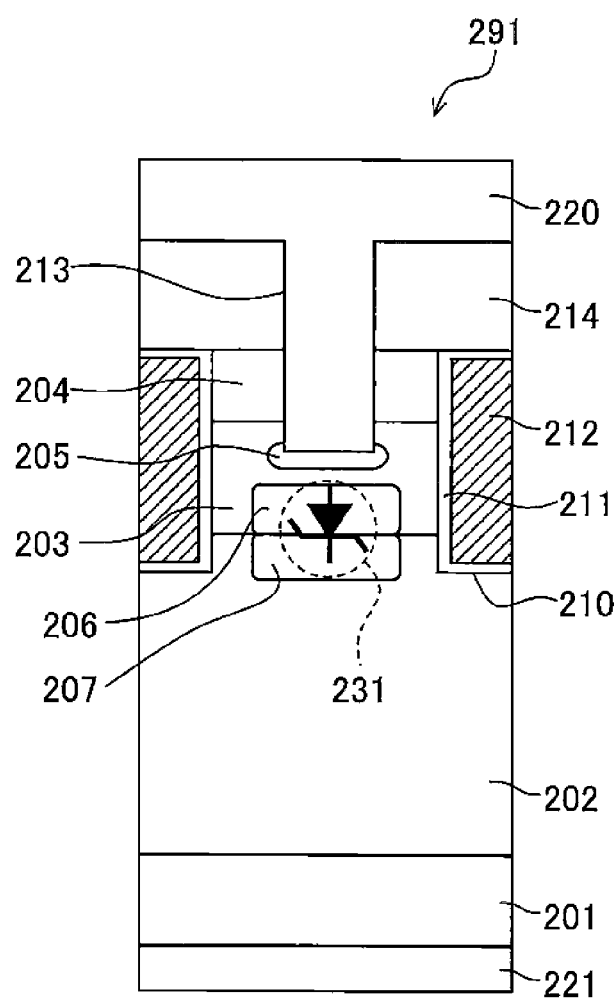
FIG. 14 is a diagram showing an example of a cross section structure of a unit cell of a MOSFET with a built-in Zener diode in an active region of the MOSFET chip with the built-in Zener diode according to a third embodiment of the present invention.

FIG. 14 is a diagram showing an example of a cross section structure of a unit cell 291 of a MOSFET with a built-in Zener diode in an active region of the MOSFET chip 103 with the built-in Zener diode according to a third embodiment of the present invention.

The unit cell 291 in FIG. 14 is different from the unit cell 290 in FIG. 5 in that a p layer 206 (sixth semiconductor layer) and an n layer 207 (fifth semiconductor layer) are provided in FIG. 14.

That is, in FIG. 5, the Zener diode 230 is formed between the p channel layer 203 and the n⁻ epitaxial layer 202. In contrast, in FIG. 14, a Zener diode 231 is formed between a p layer 206 and an n layer 207.

Unlike the case in which the Zener diode is formed at the bonding portion between the p channel layer 203 and the n⁻ epitaxial layer 202, it is possible to independently control the breakdown voltage of the Zener diode 231 from the characteristics such as the threshold voltage and the on resistance of the MOSFET by forming the Zener diode 231 at the bonding portion between the p type layer (p layer 206) and the n type layer (n layer 207).

In addition, it is necessary for the Zener diode 231 to have a lower breakdown voltage than in the vicinity of the peripheral region (FIG. 6) or the trench gate 210 (FIGS. 5 and 14). Therefore, it is preferable to set the concentration of the p layer 206 to be higher than that of the p channel layer 203 and the concentration of the n layer 207 to be higher than that of the n⁻ epitaxial layer 202.

It is to be noted that the difference between FIGS. 14 and 5 is the presence or absence of the p layer 206 and the n layer 207. Since other structures are the same, the duplicated description thereof will be omitted.

Effect of Third Embodiment

It is possible to independently control the breakdown voltage of the Zener diode 231 from the characteristics such as the threshold voltage and the on resistance of the MOSFET by forming the Zener diode 231 at the bonding portion between the p type layer (p layer 206) and the n type layer (n layer 207).

That is, it is possible to provide the semiconductor device (rectifier element) having the characteristics of the threshold voltage and the on resistance of the MOSFET and the characteristics of the breakdown voltage of the Zener diode.

Fourth Embodiment

Next, a semiconductor device (rectifier element) 500 having a reverse side structure will be described with reference to FIGS. 15 and 16.

Figure 15:
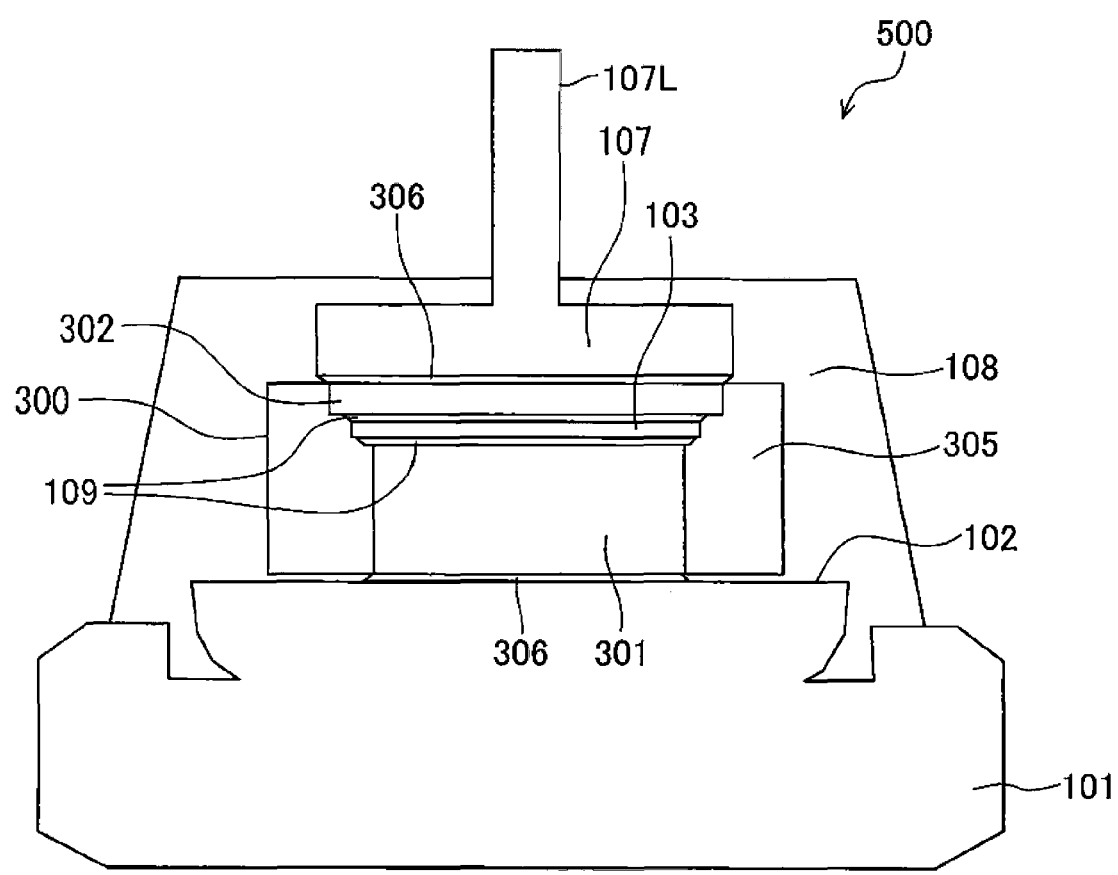
FIG. 15 is a diagram schematically showing an example of a cross section structure of XII-XII shown in FIG. 11 of a semiconductor device according to a fourth embodiment of the present invention.

FIG. 15 is a diagram schematically showing an example of a cross section structure of XII-XII shown in FIG. 11 of a semiconductor device 500 according to a fourth embodiment of the present invention.

Figure 16:
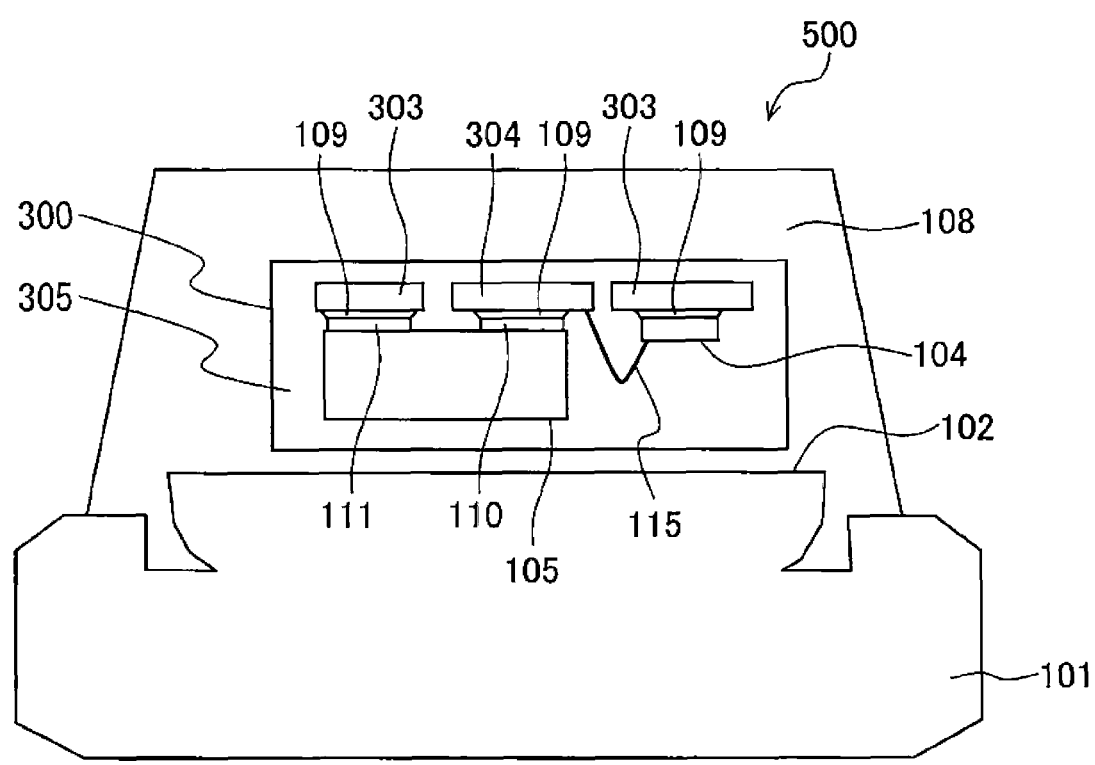
FIG. 16 is a diagram schematically showing an example of a cross section structure of XIII-XIII shown in FIG. 11 of the semiconductor device according to the fourth embodiment of the present invention.

FIG. 16 is a diagram schematically showing an example of a cross section structure of XIII-XIII shown in FIG. 11 of the semiconductor device 500 according to the fourth embodiment of the present invention.

That is, FIG. 15 schematically shows a cross section structure of XII-XII in a reverse side structure, which corresponds to a cross section structure of XII-XII in the forward side structure of FIG. 12. In addition, FIG. 16 schematically shows a cross section structure of XIII-XIII in a reverse side structure, which corresponds to a cross section structure of XIII-XIII in the forward side structure of FIG. 13.

It is to be noted that the description of the planar structure of the semiconductor device (rectifier element) 500 in the reverse side structure is omitted.

Comparing FIG. 15 showing the fourth embodiment with FIG. 12 showing the second embodiment, the main difference is that the relationship between the upper and lower sides of the electronic circuit body (internal package) 300 is reversed.

By making the upper and lower arrangement of the electronic circuit body (internal package) 300 reverse, the drain electrode 221 (FIG. 5) of the MOSFET chip 103 with the built-in Zener diode is connected to the lead electrode 107 via the drain frame 302 and the source electrode 220 (FIG. 5) is connected to the base electrode 101 via the source frame 301.

In the electronic circuit body (internal package) 300 of the second embodiment, the drain electrode 221 (FIG. 5) of the MOSFET chip 103 with the built-in Zener diode is connected to the base electrode 101 via the drain frame 302 and the source electrode 220 (FIG. 5) is connected to the lead electrode 107 via the source frame 301.

That is, the semiconductor device (rectifier element) 100 of the second embodiment has the forward side structure, whereas the semiconductor device (rectifier element) 500 of the fourth embodiment has the reverse side structure.

Comparing FIG. 16 showing the fourth embodiment with FIG. 13 showing the second embodiment, the upper and lower sides of the electronic circuit body (internal package) 300 are reversed, and thus the upper and lower arrangement of the control IC chip 104 and the capacitor 105 is reversed.

In FIG. 15, in order to smooth the misalignment of the electrical connection portion caused by reversing the relationship between the upper and lower sides of the electronic circuit body (internal package) 300, the length of the width between the lead electrode 107 and the bonding material 306 is adjusted.

In FIGS. 15 and 16, since other structures are the same, the duplicated description thereof will be omitted.

Effect of Fourth Embodiment

The semiconductor device (rectifier element) 500 having the reverse side structure can be configured by using the electronic circuit body (internal package) 300. That is, the electronic circuit body (internal package) 300 can be formed as components which are common to the forward side structure and the reverse side structure.

Therefore, it is possible to simply manufacture the semiconductor device (rectifier element) having the forward side structure and the reverse side structure at low cost.

Fifth Embodiment

Next, an example in which the semiconductor device 500 of the first to fourth embodiments is applied to the alternator will be described.

Figure 17:
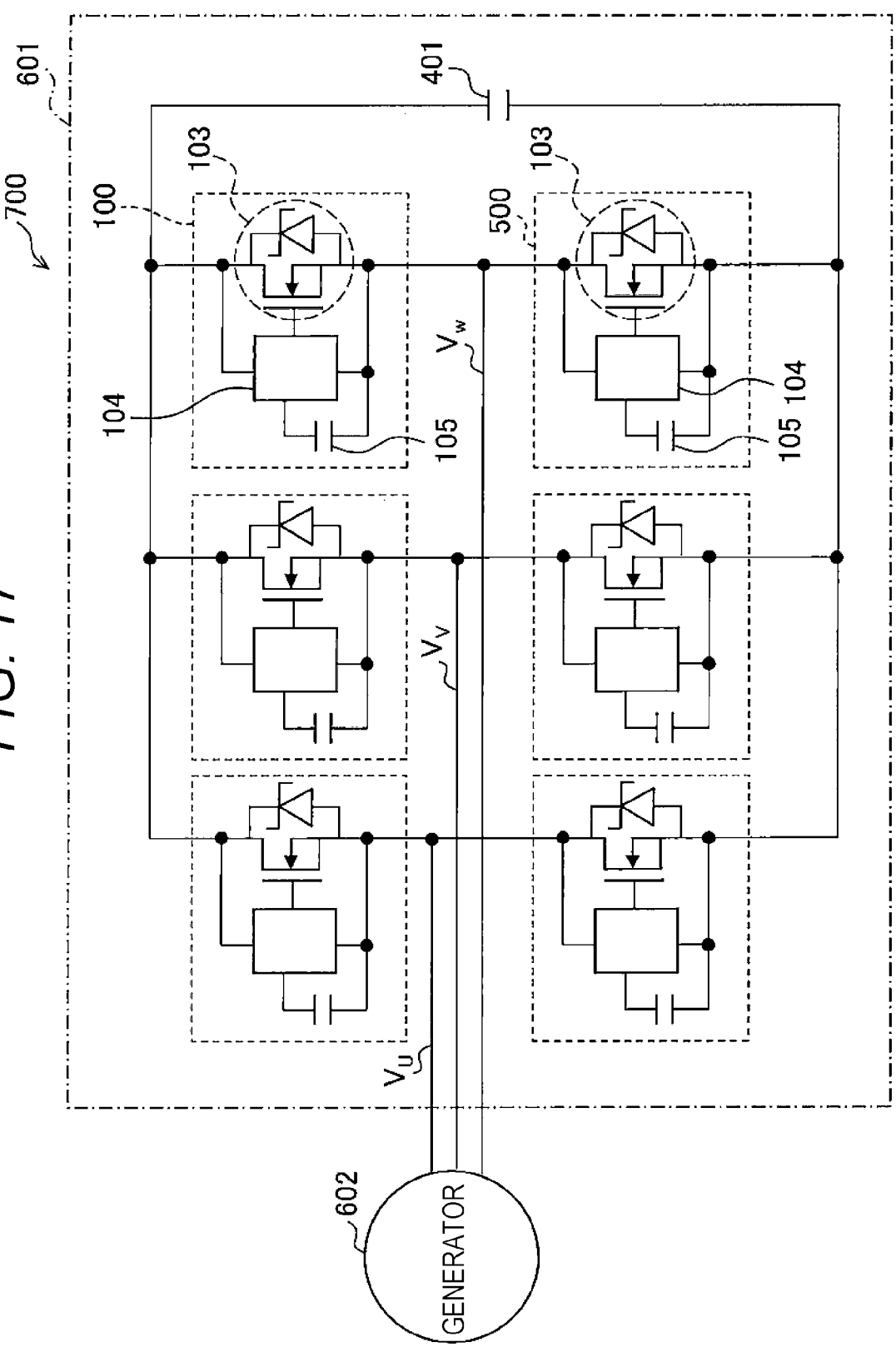
FIG. 17 is a diagram showing an example of a circuit configuration of an alternator according to a fifth embodiment of the present invention.

FIG. 17 is a diagram showing an example of a circuit configuration of an alternator 700 according to a fifth embodiment of the present invention.

In FIG. 17, the alternator 700 is configured to include a three-phase full-wave rectifier circuit 601 and a three-phase generator 602. The alternator 700 generates AC power (voltage) by the generator 602, and rectifies the AC power (voltage) thereof by the three-phase full-wave rectifier circuit 601, and generates and outputs DC power (voltage).

The three-phase full-wave rectifier circuit 601 includes a total of six rectifier elements, which are configured of three semiconductor devices (rectifier elements) 100 having a forward side (forward side structure) and three semiconductor devices (rectifier elements) 500 having a reverse side (reverse side structure), and a battery 401.

As shown in FIG. 17, a rectifier element of a forward side and a rectifier element of a reverse side are connected to each other in series, and each connection point is connected to a U phase Vu, a V phase Vv and a W phase Vw of a three-phase alternating current. The rectifier element converts a three-phase AC voltage (power) from the generator 602 into a DC voltage (power), and outputs the DC voltage (power) to the battery 401.

Effect of Fifth Embodiment

The semiconductor device (rectifier element) 100 of the forward side and the semiconductor device (rectifier element) 500 of the reverse side which include the MOSFET chip 103 with the built-in Zener diode are used to be able to provide the alternator corresponding to higher output.

In addition, it is possible to provide a highly resistant alternator even when the load dump occurs.

In addition, the semiconductor device (rectifier element) 100 of the forward side and the semiconductor device (rectifier element) 500 of the reverse side are manufactured by using the electronic circuit body (internal package) 300 to use the alternator, thereby providing the cheap alternator.

Other Embodiments

It is to be noted that the present invention is not limited to the embodiments described above, but also includes various modifications. For example, the above-described embodiments are described in detail to more easily describe the present invention, and are not necessarily limited to those having all the configurations described above. In addition, it is also possible to replace part of the configuration of any embodiment with a part of the configuration of another embodiment and to add a part or all of another configuration to the configuration of any embodiment is also possible.

Hereinafter, other embodiments or modifications will be further explained.

<<Circuit Configuration of Semiconductor Device (Rectifier Element)>>

The circuit shown in FIG. 4 is an example of the circuit configuring the semiconductor device (rectifier element) of the present invention and is not limited to this circuit. For example, the control circuit of the control IC chip 104 may also use a differential amplifier instead of the comparator 116, and control on/off based on the direction of the current flowing in the MOSFET chip 103 with the built-in Zener diode.

Further, the connection relationship between an inverting terminal and a non-inverting terminal of the comparator 116 may be reversed, and thus the inverting function may also be added to the gate driver 117.

<<Configuration of Zener Diode>>

In FIG. 14, the Zener diode is configured to include the p layer 206 and the n layer 207. It is noted to be noted that the p layer 206 has a higher impurity concentration than that of the p channel layer 203, and the n layer 207 is a higher impurity concentration than that of the n⁻ epitaxial layer 202.

However, it is not limited to the method of providing both the p layer 206 and the n layer 207 having a high impurity concentration.

For example, although the p layer 206 is used, the Zener diode may be formed between the p layer 206 and the n⁻ epitaxial layer 202 using the n⁻ epitaxial layer 202 without providing the n layer 207.

In addition, although the n layer 207 is used, the Zener diode may be formed between the n layer 207 and the p channel layer 203 using the p channel layer 203 without providing the p channel layer 206.

<<Shape of Semiconductor Device (Rectifier Element)>>

In the semiconductor device (rectifier element) 100 of the first embodiment, in FIG. 1, the base electrode 101 or the pedestal 102 is described as a circle, but is not limited to the circle. For example, even when the shape of the base electrode or the pedestal 102 is polygonal or elliptical, the MOSFET with the built-in Zener diode which is the feature of the semiconductor device (rectifier element) of the first embodiment is formed in the same unit cell, thereby increasing the output.

<<Application of Semiconductor Device (Rectifier Element)>>

The semiconductor devices (rectifier elements) of the first to fourth embodiments have been described as being used for the alternator, but are not limited to the use of the alternator. It is widely used as a rectifier element used in apparatuses to which a high breakdown voltage is likely to be applied.

What is claimed is:

1. A semiconductor device, comprising:
a first external electrode which includes a first electrode surface portion;
a second external electrode which includes a second electrode surface portion;
a MOSFET chip with a built-in Zener diode which includes an active region in which a circuit current flows and a peripheral region holding a breakdown voltage at a peripheral portion;
a control IC chip which drives a gate of the MOSFET chip with the built-in Zener diode based on a voltage or a current between a drain electrode and a source electrode of the MOSFET chip with the built-in Zener diode; and
a capacitor which supplies power to the MOSFET chip with the built-in Zener diode and the control IC chip,
wherein the first electrode surface portion is connected to either of the drain electrode or the source electrode of the MOSFET chip with the built-in Zener diode,
the second electrode surface portion is connected to either of the source electrode or the drain electrode of the MOSFET chip with the built-in Zener diode,
a plurality of unit cells are provided in the active region of the MOSFET chip with the built-in Zener diode, and
a breakdown voltage of the Zener diode included in the unit cell is set to be lower than the breakdown voltage of the peripheral region,
the MOSFET chip with the built-in Zener diode includes:
a first conductivity type first semiconductor layer which is formed on a main surface of semiconductor;

a first conductivity type second semiconductor layer which is formed on the first semiconductor layer and has an impurity concentration lower than an impurity concentration of the first semiconductor layer;

a second conductivity type third semiconductor layer which is formed on the second semiconductor layer;

a first trench portion which penetrates through the third semiconductor layer from the main surface opposite to the first semiconductor layer and reaches the second semiconductor layer;

a first conductivity type fourth semiconductor layer which is formed on the third semiconductor layer and reaches a main surface opposite to the first semiconductor layer; and a second trench portion which penetrates through the fourth semiconductor layer from the main surface opposite to the first semiconductor layer and reaches the third semiconductor layer, the Zener diode being formed on a bonding portion between the second semiconductor layer and the third semiconductor layer, a first semiconductor type fifth semiconductor layer is provided in the second semiconductor layer in the vicinity of a central part of a bonding portion between the second semiconductor layer and the third semiconductor layer, and a second conductivity type sixth semiconductor layer is provided in the third semiconductor layer in the vicinity of the central part of the bonding portion between the second semiconductor layer and the third semiconductor layer.

2. The semiconductor device according to claim 1, wherein an area of the active region of the MOSFET chip with the built-in Zener diode is A, energy generated by the Zener diode in a unit time at a time of a load dump is J, thermal conductivity of the MOSFET chip with the built-in Zener diode in a mounted state is $\lambda$, a distance from the Zener diode to a bonding material which bonds the MOSFET chip with the built-in Zener diode and the first electrode surface portion or bonds the MOSFET chip with the built-in Zener diode and the second electrode surface portion is L, a melting point of the bonding material is Tm, an ambient temperature is Ta, and a radius of a circular pedestal configured by the first electrode surface portion is r, and the following relation Equation is satisfied $$2r^2 > A > \frac{L}{\lambda} \times \frac{J}{(Tm - Ta)}. \tag{4}$$

3. The semiconductor device according to claim 1, wherein a breakdown voltage of the Zener diode is set to be lower than the breakdown voltage of the peripheral region even when the load dump occurs and a temperature of the Zener diode rises due to surge energy.

4. The semiconductor device according to claim 3, wherein an area of the active region of the MOSFET chip with the built-in Zener diode is A, energy generated by the Zener diode in a unit time at a time of a load dump is J, thermal conductivity of the MOSFET chip with the built-in Zener diode in a mounted state is $\lambda$, a distance from the Zener diode to a bonding material which bonds the MOSFET chip with the built-in Zener diode and the first electrode surface portion or bonds the MOSFET chip with the built-in Zener diode and the second electrode surface portion is L, a melting point of the bonding material is Tm, an ambient temperature is Ta, and a radius of a circular pedestal configured by the first electrode surface portion is r, and the following relation Equation is satisfied $$2r^2 > A > \frac{L}{\lambda} \times \frac{J}{(Tm - Ta)}. \tag{4}$$

5. The semiconductor device according to claim 1, wherein a shape of the MOSFET chip with the built-in Zener diode is rectangular, and the control IC chip and the capacitor are arranged in a long side direction of the rectangle.

6. The semiconductor device according to claim 1, wherein an impurity concentration of the fifth semiconductor layer is higher than an impurity concentration of the second semiconductor layer, and an impurity concentration of the sixth semiconductor layer is higher than an impurity concentration of the third semiconductor layer.

7. The semiconductor device according to claim 1, wherein a bonding material which bonds the MOSFET chip with the built-in Zener diode and the first electrode surface portion or the second electrode surface portion is bonded using sintered bonding.

8. The semiconductor device of claim 1, further comprising:

an electronic circuit body, wherein the electronic circuit body is provided between the first electrode surface portion and the second electrode surface portion, the first electrode surface portion is connected to a first surface of the electronic circuit body, and the second electrode surface portion is connected to a second surface of the electronic circuit body, the electronic circuit body includes:

a drain frame which is connected to the drain electrode of the MOSFET chip with the built-in Zener diode, and a source frame which is connected to the source electrode of the MOSFET chip with the built-in Zener diode, the first electrode surface portion is connected to one of the drain frame and the source frame, and the second electrode surface portion is connected to another of the drain frame and the source frame.

9. The semiconductor device according to claim 8, wherein an area of an active area of the MOSFET chip with the built-in Zener diode is A, energy generated by the Zener diode in a unit time at a time of the load dump is J, thermal conductivity of the MOSFET chip with the built-in Zener diode in a mounted state is $\lambda$, a distance from the Zener diode to a bonding material which bonds the MOSFET chip with the built-in Zener diode and the first electrode surface portion or bonds the MOSFET chip with the built-in Zener diode and the second electrode surface portion is L, a melting point of the bonding material is Tm, an ambient temperature is Ta, a radius of a circular pedestal configured by the first electrode surface portion is r, a length of a short side on which the control IC chip and the capacitor inside the electronic circuit body are disposed is b, and the following relation Equation is satisfied.

[Equation 5]

$$\sqrt{2}\,r \times (\sqrt{2}\,r - b) > A > \frac{L}{\lambda} \times \frac{J}{(Tm - Ta)}. \quad (5)$$

10. The semiconductor device according to claim 8, wherein
the breakdown voltage of the Zener diode is set to be lower than the breakdown voltage of the peripheral region even when a load dump occurs and a temperature of the Zener diode rises due to surge energy.

11. The semiconductor device according to claim 10, wherein
an area of an active area of the MOSFET chip with the built-in Zener diode is A, energy generated by the Zener diode in a unit time at a time of the load dump is J, thermal conductivity of the MOSFET chip with the built-in Zener diode in a mounted state is λ, a distance from the Zener diode to a bonding material which bonds the MOSFET chip with the built-in Zener diode and the first electrode surface portion or bonds the MOSFET chip with the built-in Zener diode and the second electrode surface portion is L, a melting point of the bonding material is Tm, an ambient temperature is Ta, a radius of a circular pedestal configured by the first electrode surface portion is r, a length of a short side on which the control IC chip and the capacitor inside the electronic circuit body are disposed is b, and the following relation Equation is satisfied.

[Equation 5]

$$\sqrt{2}\,r \times (\sqrt{2}\,r - b) > A > \frac{L}{\lambda} \times \frac{J}{(Tm - Ta)}. \quad (5)$$

12. The semiconductor device according to claim 8, wherein
a shape of the MOSFET chip with the built-in Zener diode is rectangular, and the control IC chip and the capacitor are arranged in a long side direction of the rectangle.

13. An alternator comprising the semiconductor device according to claim 1.

14. The alternator according to claim 13, wherein
a breakdown voltage of the Zener diode is set to be lower than the breakdown voltage of the peripheral region even when a load dump occurs and a temperature of the Zener diode rises due to surge energy.

15. The alternator according to claim 13, wherein
a shape of the MOSFET chip with the built-in Zener diode is rectangular, and the control IC chip and the capacitor are arranged in a long side direction of the rectangle.

16. The alternator according to claim 13, further comprising:
a semiconductor device of a forward high side and a semiconductor device of a reverse low side.

17. The alternator according to claim 16, wherein
a breakdown voltage of the Zener diode is set to be lower than the breakdown voltage of the peripheral region even when a load dump occurs and a temperature of the Zener diode rises due to surge energy.

18. The alternator according to claim 16, wherein
a shape of the MOSFET chip with the built-in Zener diode is rectangular, and the control IC chip and the capacitor are arranged in a long side direction of the rectangle.

* * * * *